USO11749569B2

(12) United States Patent
Lee et al.

(10) Patent No.: US 11,749,569 B2
(45) Date of Patent: Sep. 5, 2023

(54) METHOD FOR NON-DESTRUCTIVE INSPECTION OF CELL ETCH REDEPOSITION

(71) Applicant: Taiwan Semiconductor Manufacturing Co., Ltd., Hsin-Chu (TW)

(72) Inventors: I-Che Lee, Hsin-Chu (TW); Huai-Ying Huang, Jhonghe (TW); Yi Chien Lee, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 159 days.

(21) Appl. No.: 17/038,242

(22) Filed: Sep. 30, 2020

(65) Prior Publication Data

US 2021/0351088 A1    Nov. 11, 2021

Related U.S. Application Data

(60) Provisional application No. 63/020,635, filed on May 6, 2020.

(51) Int. Cl.
*H01L 21/66* (2006.01)
*H01L 21/67* (2006.01)
(Continued)

(52) U.S. Cl.
CPC ............ *H01L 22/12* (2013.01); *G06T 7/0004* (2013.01); *H01L 21/67069* (2013.01);
(Continued)

(58) Field of Classification Search
CPC ............... H01L 22/12; H01L 21/67069; H01L 21/67253; H01L 43/12; H01L 22/20;
(Continued)

(56) References Cited

U.S. PATENT DOCUMENTS 8,089,297 B2 *  1/2012  Xiao .................... H01L 22/12
                                                    324/762.01
8,853,628 B2 * 10/2014  Hosoya ................ H01J 37/28
                                                    250/311
(Continued)

FOREIGN PATENT DOCUMENTS

DE         19860704 B4    12/1999
DE         10000364 A1 *   7/2000 ........... G01R 31/307
(Continued)

OTHER PUBLICATIONS

Xu et al. "Designing a Practical Access Point Association Protocol" 2010 Proceedings IEEE INFOCOM, published on May 6, 2010.
(Continued)

*Primary Examiner* — Mohammed Shamsuzzaman
(74) *Attorney, Agent, or Firm* — Eschweiler & Potashnik, LLC

(57) ABSTRACT

Various embodiments of the present disclosure are directed towards a method for non-destructive inspection of cell etch redeposition. In some embodiments of the method, a grayscale image of a plurality of cells on a wafer is captured. The grayscale image provides a top down view of the cells and, in some embodiments, is captured in situ after etching to form the cells. The cells are identified in the grayscale image to determine non-region of interest (non-ROI) pixels corresponding to the cells. The non-ROI pixels are subtracted from the grayscale image to determine ROI pixels. The ROI pixels are remaining pixels after the subtracting and correspond to material on sidewalls of, and in recesses between, the cells. An amount of etch redeposition on the sidewalls and in the recesses is then scored based on gray levels of the ROI pixels. Further, the wafer is processed based on the score.

20 Claims, 22 Drawing Sheets

(51) Int. Cl.
    *G06T 7/00*       (2017.01)
    *H10N 50/01*      (2023.01)

(52) U.S. Cl.
    CPC ....... *H01L 21/67253* (2013.01); *H10N 50/01* (2023.02); *G06T 2207/10061* (2013.01); *G06T 2207/30148* (2013.01)

(58) Field of Classification Search
    CPC . H01L 27/228; H01L 21/67063; H01L 43/08; G06T 7/0004; G06T 2207/10061; G06T 2207/30148; G06T 2207/20224; G06T 2210/36; G01N 21/8851; G01N 21/9501
    See application file for complete search history.

(56) References Cited

U.S. PATENT DOCUMENTS

| | | | | |
|---|---|---|---|---|
| 9,940,704 | B2* | 4/2018 | Yati | G06T 7/0004 |
| 10,460,434 | B2* | 10/2019 | Martin | G06T 7/001 |
| 10,697,900 | B2* | 6/2020 | Zhang | G01N 23/2251 |
| 2005/0152594 | A1* | 7/2005 | Jau | G06T 7/0004 382/145 |
| 2019/0066291 | A1* | 2/2019 | Martin | G06T 7/0008 |

FOREIGN PATENT DOCUMENTS

| | | | | |
|---|---|---|---|---|
| DE | 102006014812 A1 | * | 12/2006 | ........... G06T 7/0004 |
| DE | 69738441 T2 | * | 12/2008 | ........... H04N 1/4051 |
| JP | 2000208575 A | * | 7/2000 | ........... G01R 31/307 |
| JP | 2013257304 A | * | 12/2013 | ............. G06T 7/001 |
| JP | 6514726 B2 | * | 5/2019 | ......... G01N 15/1475 |
| WO | WO-0135072 A2 | * | 5/2001 | ......... G01N 33/5091 |
| WO | WO-03021231 A2 | * | 3/2003 | ............. G01N 21/47 |

OTHER PUBLICATIONS

Jeon et al. "Etch residue removal of CoFeB using CO/NH3 reactive ion beam for spin transfer torque magnetic random access memory device." J. Vac Sci. Technol. B 33, 061212 (2015), published on Nov. 25, 2015.

Lorusso et al. "Enabling CD SEM Metrology for 5nm Technology Node and Beyond." Proc. of SPIE vol. 10145, 1014512, published on Mar. 28, 2017.

Lee, Robert E. "Microfabrication by ion-beam etching." Journal of Vacuum Science and Technology 16, 164 (1979), published on Mar. 13, 1979.

Hitachi. "Review SEM+What is a Review SEM?" The date of publication is unknown. Retrieved online on Sep. 2, 2020 from https://www.hitachi-hightech.com/global/products/device/semiconductor/review-sem.html.

* cited by examiner

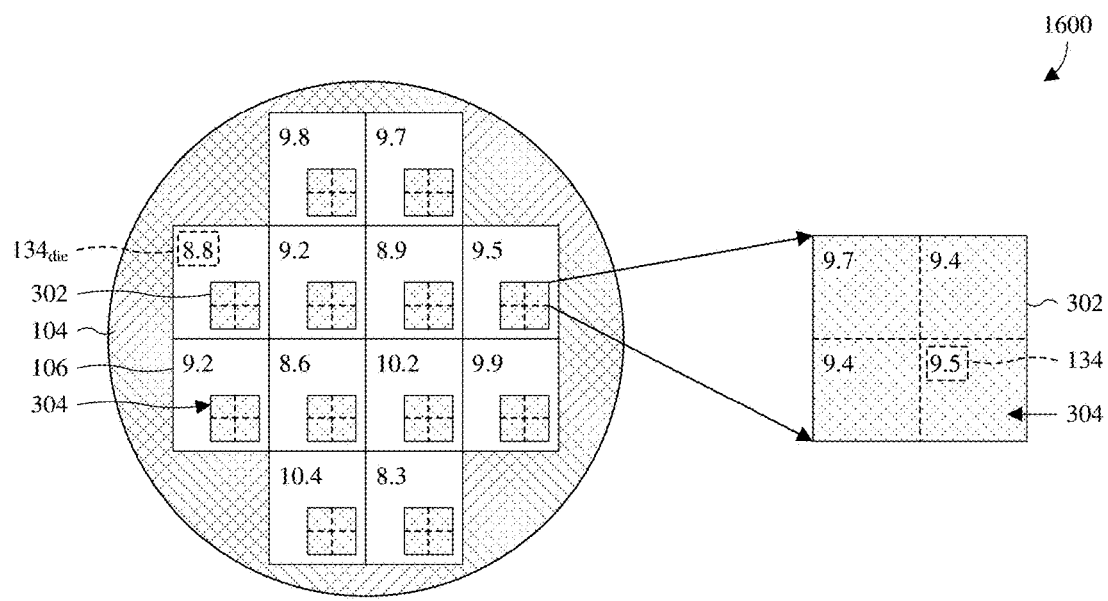
Fig. 16
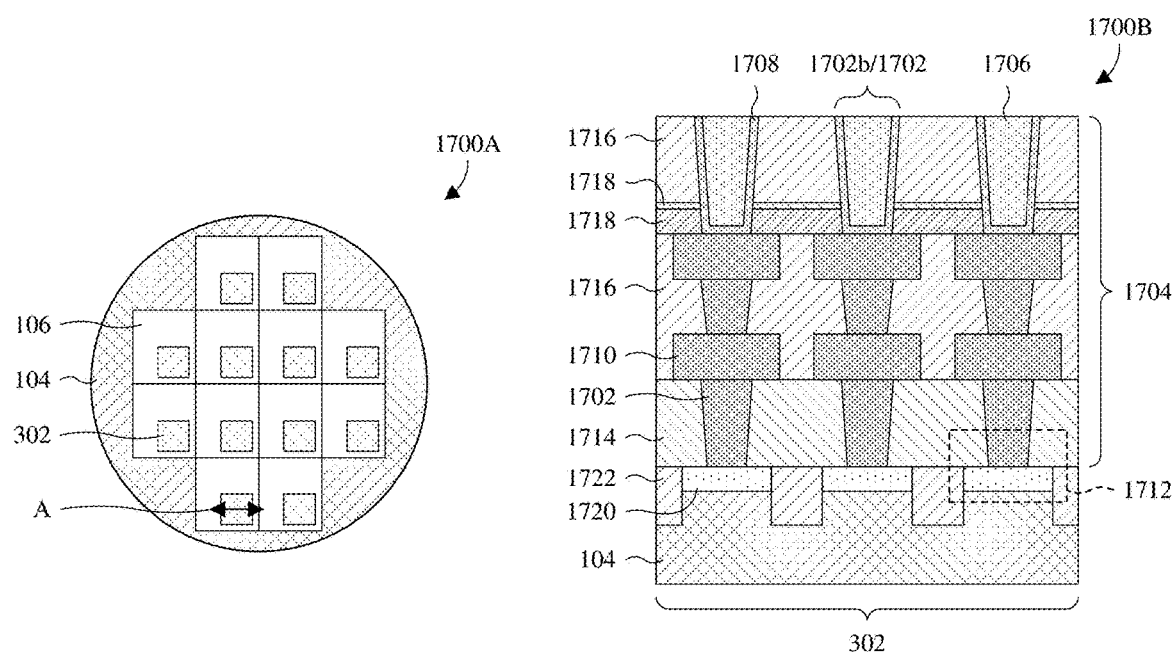
Fig. 17A                    Fig. 17B

METHOD FOR NON-DESTRUCTIVE INSPECTION OF CELL ETCH REDEPOSITION

REFERENCE TO RELATED APPLICATION

This application claims the benefit of U.S. Provisional Application No. 63/020,635, filed on May 6, 2020, the contents of which are incorporated herein by reference in their entirety.

BACKGROUND

During the manufacture of integrated circuits (ICs), multi-step sequences of semiconductor manufacturing processes are performed to gradually form electronic circuits on semiconductor substrates. One such semiconductor manufacturing process is dry etching. Dry etching removes material by ion bombardment and is often highly anisotropic.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 16 illustrates some alternative embodiments of a diagram of FIG. 10 in which scores are determined individually for IC dies.

FIGS. 17A and 17B, 18, 19, 20A, 20B, and 21-28 illustrate some embodiments of a method for forming an integrated circuit (IC) with non-destructive inspection of cell etch redeposition.

DETAILED DESCRIPTION

Figure 1:
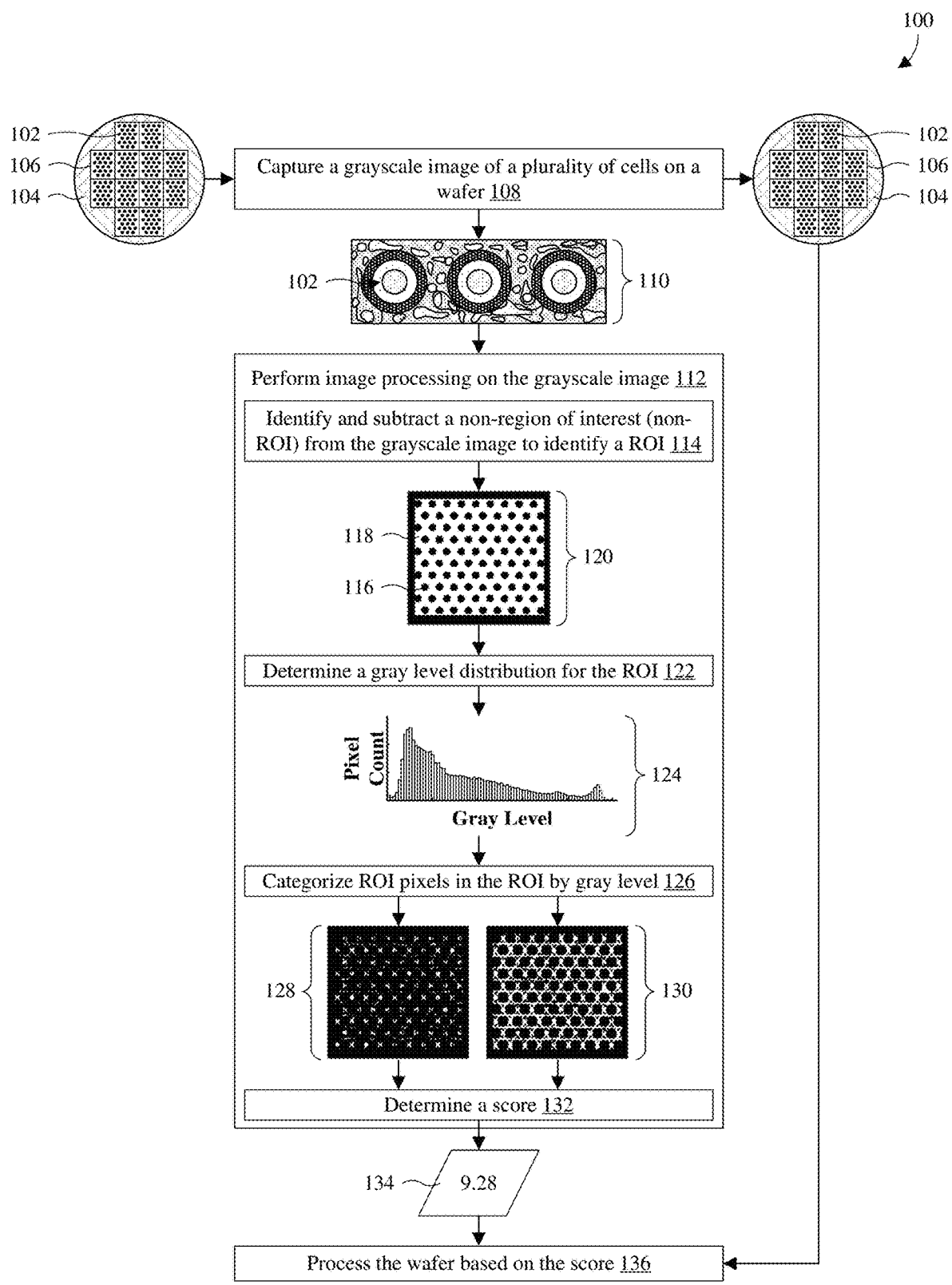
FIG. 1 illustrates a schematic flow diagram of some embodiments of a method for non-destructive inspection of cell etch redeposition.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A method for forming magnetoresistive random-access memory (MRAM) may comprise: depositing a multilayer film over a wafer; forming hard masks over the multilayer film; and performing a dry etch into the multilayer film to form an array of magnetic tunnel junction (MTJs). A challenge with the method is that the dry etch employs ion bombardment for etching and, as a result, is somewhat uncontrollable. Etched material may redeposit on sidewalls of the MTJs and may lead to high leakage between fixed and free elements of the MTJs. Because of the high leakage, the redeposited material has the potential to significantly degrade yields.

To mitigate degradation in yields from sidewall redeposition, quantitative inspection may be performed to determine the amount of redeposition and to determine whether to rework a wafer. According to a first inspection method, an individual manually inspects one or a few MTJs top down using a scanning electron microscope (SEM). However, redeposited material occupies a small area when viewed top down and contrast between redeposited material and neighboring material may be low. As a result, it may be difficult for an individual to reliably assess sidewall redeposition and the sensitivity of the first inspection process may be low. Further, because inspection is performed manually, throughput may be low and the number of MTJs assessed may be low. According to a second inspection method, an individual manually prepares and inspects a cross section of one or a few MTJs using a transmission electron microscope (TEM). However, preparing the cross section is destructive and hence leads to waste of a costly wafer. Further, because preparation and inspection are performed manually, throughput may be low and the number of MTJs assessed may be low. Further yet, because of the preparation, inspection is performed ex situ and adds complexity to workflows.

Various embodiments of the present disclosure are directed towards a method for non-destructive inspection of cell etch redeposition. In some embodiments of the method, a grayscale image of a plurality of cells on a wafer is captured. The grayscale image provides a top down view of the cells and, in some embodiments, is captured in situ after etching to form the cells. In some embodiments, the grayscale image is captured using a SEM and/or the cells are MTJs. The cells are identified in the grayscale image to determine non-region of interest (non-ROI) pixels corresponding to the cells. The non-ROI pixels are subtracted from the grayscale image by an image processing device to determine ROI pixels. The ROI pixels are remaining pixels and correspond to material on sidewalls of, and in recesses between, the cells. An amount of etch redeposition on the sidewalls and in the recesses is then scored by the image processing device based on gray levels of the ROI pixels. Further, the wafer is processed based on the score. For example, if the score indicates a threshold amount of etch redeposition, the cells may be reworked (e.g., removed and reformed). Otherwise, the wafer may proceed to a next processing step for forming an integrated circuit (IC) comprising the cells.

Because the image is captured in situ, the method may be performed with little to no impact on existing workflows and with little to no preparation. Because the image is captured top down (e.g., using a SEM), the image may capture a large area and a large number of cells. Further, the method may be performed non-destructively. Because much of the method is performed by the image processing device, etch redeposition on the large number of cells may be quickly and reliably assessed. Because the method looks at gray levels of individual pixels, the method may achieve high sensitivity. Because the method simplifies the amount of etch redeposition to a score, a problematic amount of etch redeposition may be readily identified.

For some embodiments, the cells may be in a periodic pattern. For example, the cells may be in a periodic pattern when the cells are MTJs in an array. In embodiments in which the cells are in a periodic pattern, positioning within the grayscale image may be readily achieved. After locating a single cell in the grayscale image, locations for a remainder of the cells may be calculated using the location of the single cell and the periodic pattern.

With reference to FIG. 1, a schematic flow diagram 100 of some embodiments of a method for non-destructive inspection of cell etch redeposition is provided. The method is performed after an etch forming a plurality of cells 102 (represented by black circles) on a wafer 104. The etch may, for example, be performed by dry etching using ion bombardment, such that the etch has a high propensity for material to redeposit on sidewalls of the cells 102. The cells 102 are spread across a plurality of IC dies 106 of the wafer 104 and may, for example, be or comprise MTJs, gate stacks of logic devices, or some other suitable cell structure.

At 108, a grayscale image 110 (only partially shown) of the cells 102 at a portion of the wafer 104 is captured. Note that different hashes are employed to represent different gray levels. The grayscale image 110 provides a top down view of the cells 102 and may, for example, be captured by a SEM, a review SEM (RSEM), or some other suitable imaging device. Because the grayscale image 110 provides a top down view of the cells 102, the grayscale image 110 may be captured non-destructively and with little to no preparation of the wafer 104. This, in turn, may reduce manufacturing costs and/or increase throughput. Further, because the grayscale image 110 is captured top down, the grayscale image 110 may capture a large area and a large number of cells.

In some embodiments, the grayscale image 110 is captured in situ within a process chamber employed for the etch to form the cells 102. For example, the etch and the image capture may be performed within a common process chamber and the wafer 104 may remain in the common process chamber from a beginning of the etch to an end of the image capture. In at least embodiments in which the grayscale image 110 is captured in situ, the method may be performed with little to no impact on existing workflows and with little to no preparation. As a result, throughput may be high. In alternative embodiments, the grayscale image 110 is captured ex situ and is hence captured outside the process chamber employed for the etch.

After capturing the grayscale image 110, image processing is performed on the grayscale image 110 at 112 so as to assess the quantity of etch redeposition on sidewalls of the cells 102. Depending upon materials etched, the etch redeposition may be conductive and may include, for example, titanium, ruthenium, tantalum, some other suitable material(s), or any combination of the foregoing. Because the etch redeposition may be conductive, the etch redeposition may increase leakage current. For example, where the cells 102 are MTJs, etch redeposition may increase leakage current from fixed layers to free layers. The increased leakage current may, in turn, degrade yields. In some embodiments, the image processing is wholly automated and performed by an image processing device.

At 114, a non-ROI 116 is identified and subtracted from the grayscale image 110 to identify a ROI 118. For clarity, this is schematically illustrated by a mask image 120. The non-ROI 116 (illustrated by black in the mask image 120) includes regions of the grayscale image 110 corresponding to the cells 102 and further includes a peripheral region of the grayscale image 110. The peripheral region extends in a closed path along a periphery of the grayscale image 110 and may, for example, have a square ring shape or some other suitable shape. In alternative embodiments, the non-ROI 116 is limited to regions of the grayscale image corresponding to the cells and hence does not include the peripheral region. The ROI 118 (illustrated by white in the mask image 120) corresponds a remainder of the grayscale image 110 after subtracting the non-ROI 116 from the grayscale image 110. In other words, the ROI 118 corresponds to regions of the grayscale image 110 between the cells 102.

Identification of the non-ROI 116 comprises identification of the cells 102 in the grayscale image 110. In some embodiments, the cells 102 are randomly or pseudo randomly arranged. In at least some embodiments in which the cells 102 are randomly or pseudo randomly arranged, each of the cells 102 is individually identified manually or automatically. As to manual identification, an individual may, for example, draw a circle or some other closed shape around the cells 102 using a human interface device (HID) (e.g., a mouse) and a graphical user interface (GUI) displayed on display device. As to automatic identification, the image processing device may, for example, automatically identify the cells 102 by computer vision. In other embodiments, the cells 102 are arranged in a periodic pattern. For example, the cells 102 may be in a plurality of rows and a plurality of columns to define an array. In at least some of such embodiments, a single one, or more than one, of the cells 102, but fewer than all of the cells 102, is/are identified manually or automatically by computer vision and a remainder of the cells 102 are identified by calculating locations of the remaining cells from the location of the single cell and from the periodic pattern. When more than one of the cells 102 are identified manually, or automatically by computer vision, the locations of the remaining cells may be calculated more accurately.

At 122, a gray level distribution 124 is determined for pixels of the grayscale image 110 in the ROI 118. Such pixels may also be known as ROI pixels. In some embodiments, the ROI pixels are 8-bit pixels, such that the gray levels vary from 0-255. In other embodiments, the ROI pixels have some other suitable number of bits. The gray level distribution 124 includes a pixel count for each gray level or quantile of gray levels. In some embodiments, the gray level distribution 124 is determined automatically by the image processing device.

At 126, the ROI pixels are categorized by gray level into a severe category, a slight category, and a normal category. In alternative embodiments, more or less categories are amenable. The severe category is defined by ROI pixels having a high likelihood of corresponding to etch redeposition and is illustrated by a severe ROI image 128. The severe ROI image 128 is black and white. Further, severe ROI pixels are illustrated in white and a remainder of pixels in the grayscale image 110 are illustrated in black. The slight category is defined by ROI pixels having a medium likelihood of corresponding to etch redeposition and is illustrated by a slight ROI image 130. The slight ROI image 130 is black and white. Further, slight ROI pixels are illustrated in white and a remainder of pixels in the grayscale image 110 are illustrated in black. The normal category is defined by a remainder of the ROI pixels, which have a low likelihood of corresponding to etch redeposition. In some embodiments, the categorization is performed automatically by the image processing device.

It has been appreciated that the likelihood of a pixel corresponding to etch redeposition is proportional to gray level. As such, ROI pixels with gray levels less than a first threshold are assigned to the normal category, and ROI pixels with gray levels greater than a second threshold greater than the first threshold are assigned to the severe category. Further, ROI pixels between the first and second thresholds are assigned to the slight category.

While the method focuses on a single grayscale image, the method will practically be repeated for a plurality of grayscale images. For example, one or more grayscale images may be captured per IC die 106. Further, while image capture conditions are ideally the same while capturing the plurality of grayscale image, this may not always be the case. As such, normalization is performed while categorizing the ROI pixels using an average gray level of the ROI pixels. Particularly, the first and second thresholds are summations of the average gray level with respective offsets. For example, the first threshold may be a summation of the average gray level with a first offset, and the second threshold may be a summation of the average gray level with a second offset greater than the first offset.

Defining the first and second thresholds as above has the effect of using relative brightness differences of the ROI pixels for categorizing the ROI pixels without having to directly calculate the relative brightness differences for the ROI pixels. Particularly, relative brightness difference for a given ROI pixel is a difference between the average gray level and a gray level of the given ROI pixel. Because categorization is performed by mathematical comparisons of the gray levels of the ROI pixels to the first and second thresholds, and because the first and second thresholds are summations of the average gray level and the respective offsets, the average gray level may be subtracted from each side of the mathematical comparisons without changing the effect of the mathematical comparisons. Further, the mathematical comparisons may be rewritten as mathematical comparisons of the offsets to the relative brightness differences. Therefore, the offsets may be regarded as thresholds for categorization of the ROI pixels in the relative-brightness-difference domain.

At 132, a score 134 is determined based on the numbers of ROI pixels in the different categories. The greater a ratio of the severe ROI pixels to a total number of ROI pixels, the higher the score. Further, in some embodiments, the greater a ratio of the slight ROI pixels to a total number of ROI pixels, the higher the score. The higher the score, the more etch redeposition on sidewalls of the cells 102. In some embodiments, the scoring is performed automatically by the image processing device. In some embodiments, the score 134 is a percentage of ROI pixels that are severe. In other embodiments, the score 134 is a percentage of ROI pixels that are severe and slight.

At 136, the wafer 104 undergoes processing based on the score 134. For example, prior to the method, the wafer 104 may be proceeding through a series of processing steps to form an IC at each of the IC dies 106. Based on the score 134, the wafer 104 may proceed to a next processing step in the series or may otherwise undergo rework. The rework may, for example, include removing and reforming cells. The reforming may, for example, include repeating processing steps in the series.

The processing at 136 comprises assessing the score 134 to determine whether the wafer 104 should undergo rework. Note that the score 134 may be one of many other parameters assessed. To the extent that rework is deemed appropriate, the wafer 104 may wholly undergo rework. For example, all cells 102 on the wafer 104 may be reworked. Alternatively, only one or more select portions of the wafer 104 (e.g., a portion of the wafer 104 corresponding to the grayscale image 110) may be reworked. To the extent that rework is deemed inappropriate, the wafer 104 may proceed to a next processing step. In some embodiments, if the score 134 is greater than a threshold (e.g., the amount of etch redeposition is high), the portion of wafer 104 corresponding to the grayscale image 108 is reworked.

The processing at 136 may be performed manually or automatically. For example, the score 134 may be displayed on a display device. An individual may then assess the score 134 and adjust processing of the wafer 104 as appropriated based on the score 134. As another example, a process control system may automatically compare to the score 134 to a threshold and may automatically route the wafer 104 using a transport system.

Figure 2A:
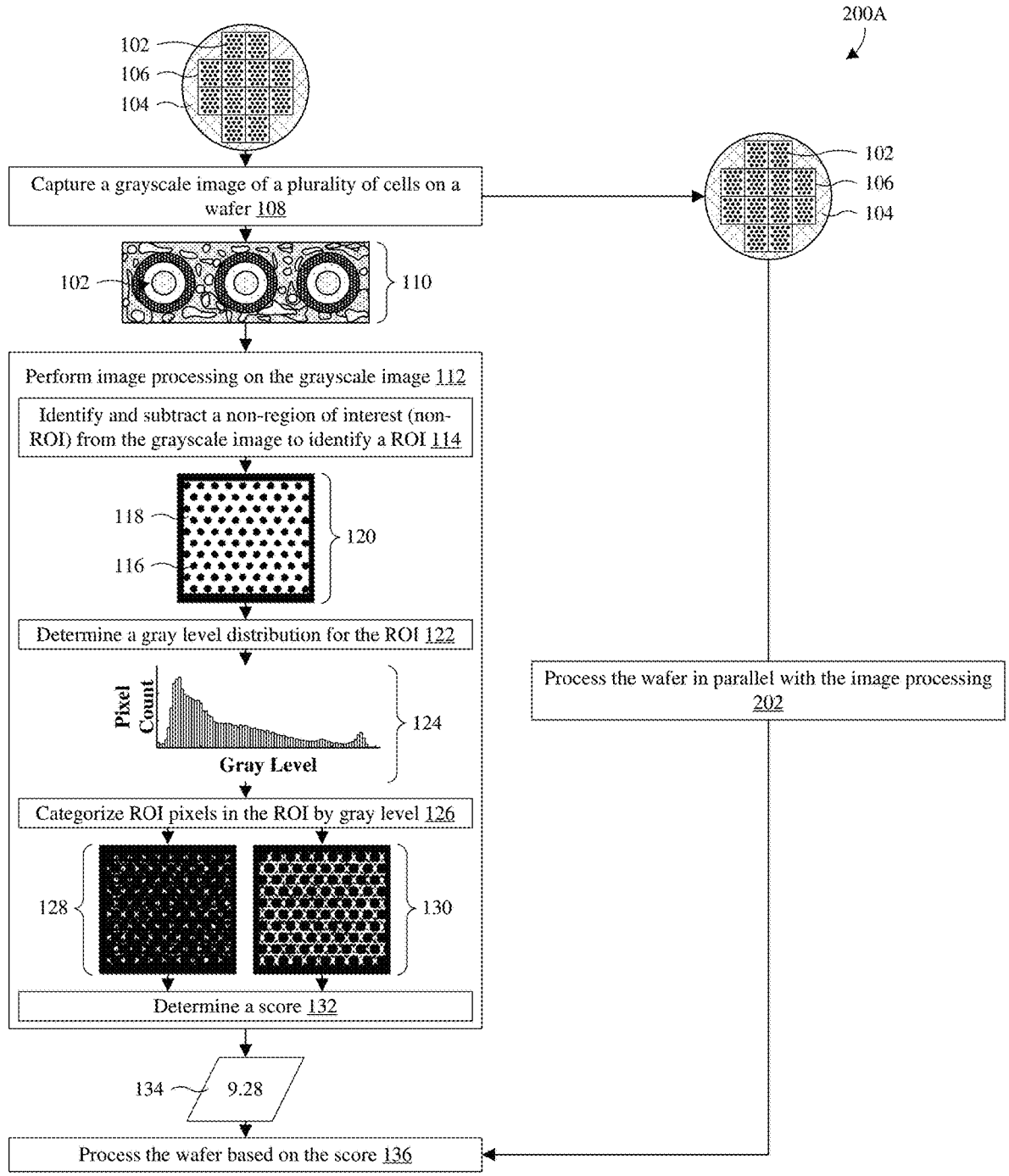
FIGS. 2A and 2B illustrate schematic flow diagrams of some alternative embodiments of the method of FIG. 1.
Figure 2B:
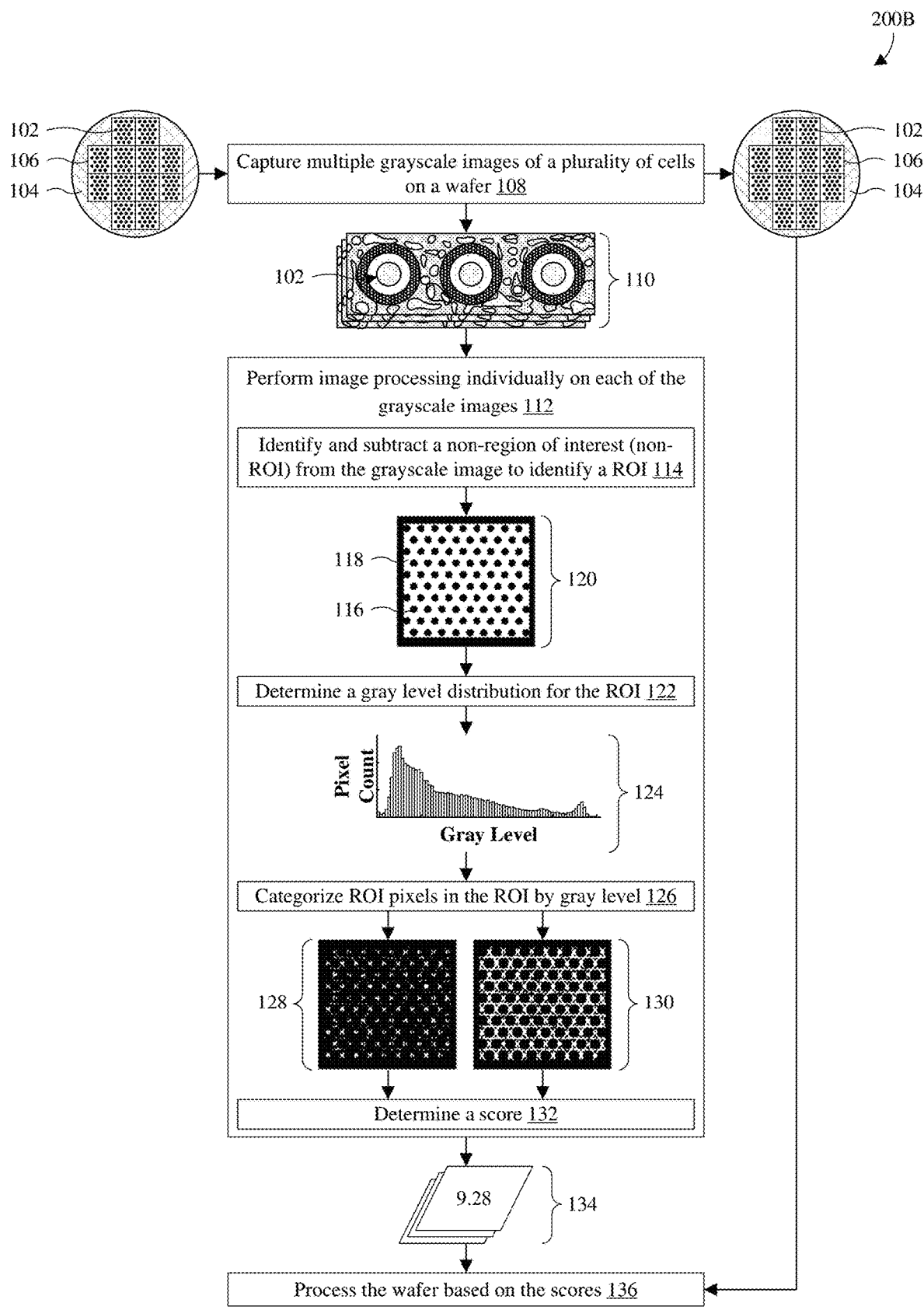

With reference to FIGS. 2A and 2B, schematic flow diagrams 200A, 200B of some alternative embodiments of the method of FIG. 1 are provided.

In FIG. 2A, the wafer 104 undergoes processing at 202 that runs in parallel with the image processing at 112. For example, a cap layer may be deposited over the cells 102. In contrast with FIG. 1, processing of the wafer 104 is in series with the image processing and is hence suspended until the imaging processing is completed. The processing at 202 may proceed according to a series of processing steps that is independent of the method and that is employed to form an IC at each of the IC dies 106. Further, once the image processing at 112 is complete, the cells 102 may be reworked if deemed appropriate based on the score 134. Otherwise, the wafer 104 may continue with the series of processing steps.

In FIG. 2B, a plurality of grayscale images 110 is captured of the cells 102 respectively at a plurality of different portions of the wafer 104. Further, the grayscale images 110 each individually undergoes the image processing at 112. In some embodiments, a plurality of grayscale images of cells is captured per IC die 106. By performing the image processing individually on the grayscale images 110, a plurality of scores 134 individual to the grayscale images 110 are generated and used for processing the wafer 104 at 136.

At 136, the scores 134 are assessed to select which, if any portions, the wafer 104 should undergo rework. In some embodiments, the scores 134 are individually assessed and, for each score 134 exceeding the threshold, the corresponding portion of the wafer 104 is selected for rework. In alternative embodiments, the scores 134 are grouped and the groups are individually assessed. For example, the scores 134 may be grouped by IC die 106 or by pairs or sets of neighboring IC dies 106. For each group, a composite score is calculated and, if the composite score exceeds a threshold, the corresponding portion of the wafer 104 is selected for rework. The composite score for a group may, for example, be an average, a median, a maximum, a minimum, or a standard deviation for the scores of the group. To the extent that rework is deemed inappropriate, the wafer 104 may proceed according to a series of processing steps that is independent of the method and that is employed to form an IC at each of the IC dies 106. To the extent that rework is deemed appropriate, the wafer 104 may be wholly reworked. Alternatively, only the one or more select portions of the wafer 104 are reworked.

In some embodiments, a plurality of grayscale images of cells is captured per IC die 106, such that each IC die 106 has a plurality of scores. For each IC die 106, the scores of the IC die are combined into a composite score and the composite score is compared to a threshold. For example, the composite score of an IC die may be an average, a median, a maximum, a minimum, or a standard deviation for the scores of the IC die. If any of the IC dies 106, or a threshold number of the IC dies 106, have composite scores in excess of the threshold, the wafer 104 may undergo rework in which cells are removed and recreated. For example, all of the IC dies 106 may undergo rework. As another example, only those IC dies 106 having composite scores in excess of threshold may undergo rework.

While the schematic flow diagram 200B of FIG. 2B is illustrated without the processing at 202 of FIG. 2A, alternative embodiments of the schematic flow diagram 200B may include the processing at 202 of FIG. 2A. As such, the wafer 104 may undergo processing at 202 that runs in parallel with the image processing at 112 in alternative embodiment of FIG. 2B.

With reference to FIGS. 3, 4, 5A, 5B, 6-8, 9A-9C, 10, and 11, some embodiments of the method of FIG. 1 are illustrated in more detail.

Figure 3:
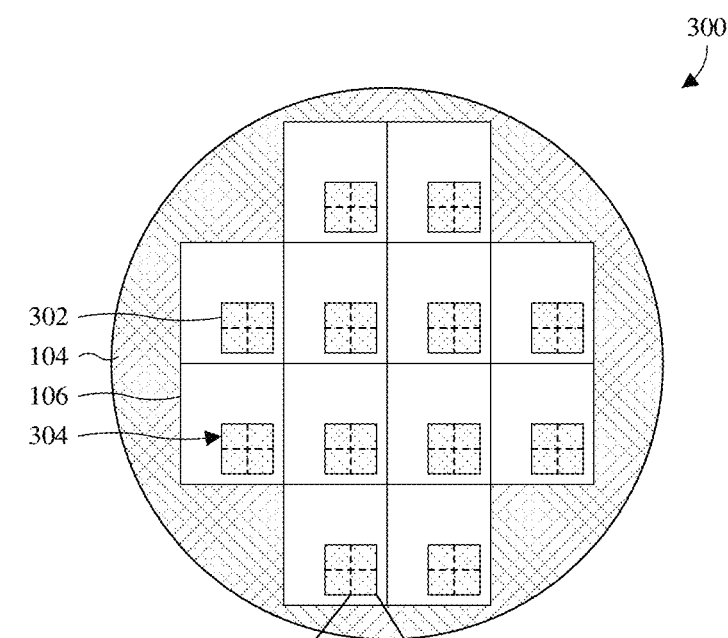
FIGS. 3, 4, 5A, 5B, 6-8, 9A-9C, 10, and 11 illustrate some embodiments of the method of FIG. 1 in more detail.

As illustrated by a diagram 300 of FIG. 3, a wafer 104 is provided upon completion of etching to form cells (not shown) on the wafer 104. The wafer 104 has a plurality of IC dies 106 sharing a common layout and having individual cell regions 302. The cell regions 302 accommodate the cells and are divided into cell subregions 304 (demarcated by the dashed lines). The cell subregions 304 may, for example, have a same size as a field of view of a SEM or some other suitable imaging device used hereafter to capture gray scale images.

Figure 4:
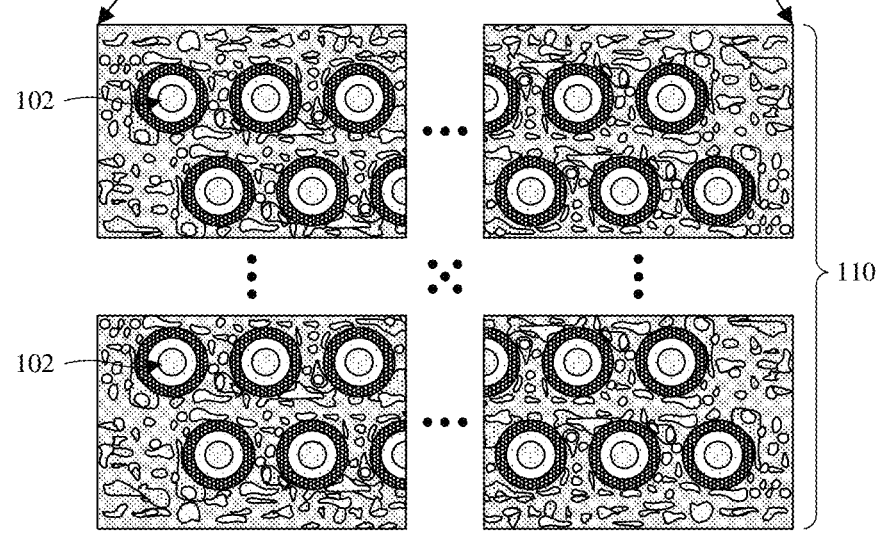

As illustrated by FIG. 4, a grayscale image 110 of a plurality of cells 102 at a cell subregion 304 of FIG. 3 is captured. Note that different hashes are employed to represent different gray levels. The grayscale image 110 provides a top down view of the cells 102 and may, for example, be captured by a SEM, a RSEM, or some other suitable imaging device.

Figure 5A:
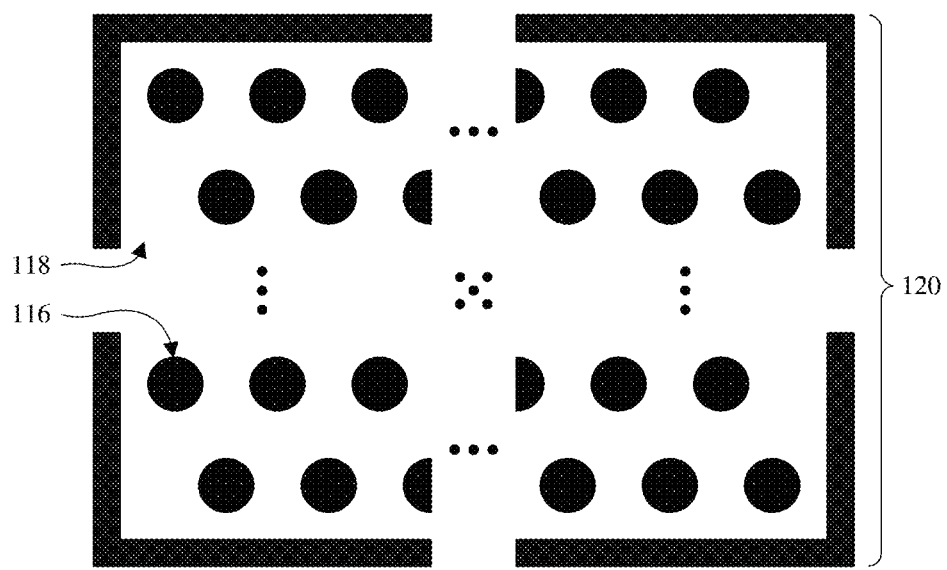
Figure 5B:
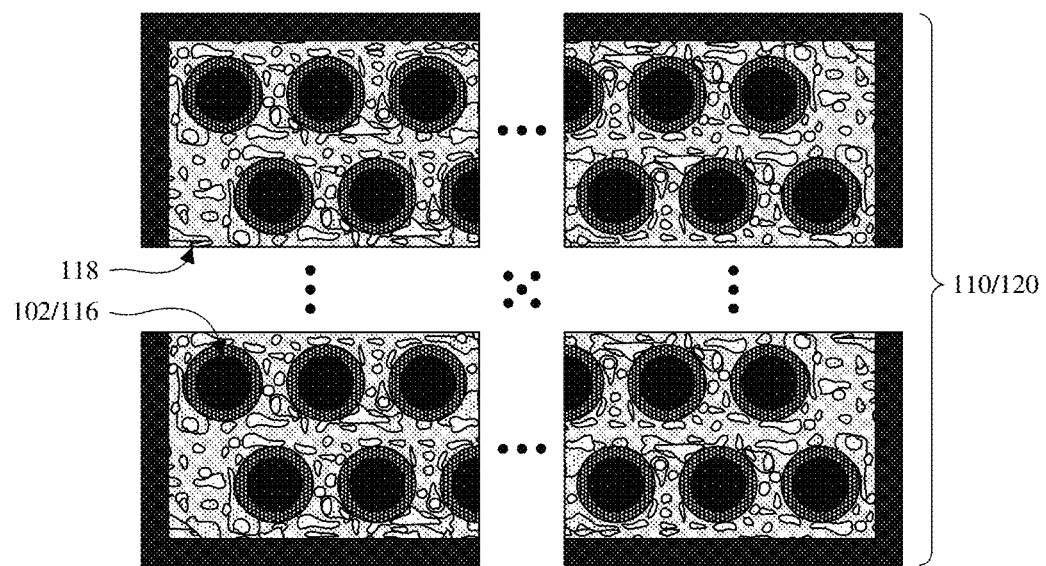

As illustrated FIGS. 5A and 5B, a non-ROI 116 is identified and subtracted from the grayscale image 110 to identify a ROI 118. In FIG. 5A, this is illustrated by a mask image 120 in which the non-ROI 116 is illustrated by black and in which the ROI 118 is illustrated by white. In FIG. 5B, this is illustrated by overlaying the black region of the mask image 120 (which corresponds to the non-ROI 116) on the grayscale image 110. The non-ROI 116 includes regions of the grayscale image 110 corresponding to the cells 102 and further includes a peripheral region of the grayscale image 110. The ROI 118 corresponds a remainder of the grayscale image 110 after subtracting the non-ROI 116 and hence corresponds to regions of the grayscale image 110 between the cells 102.

Figure 6:
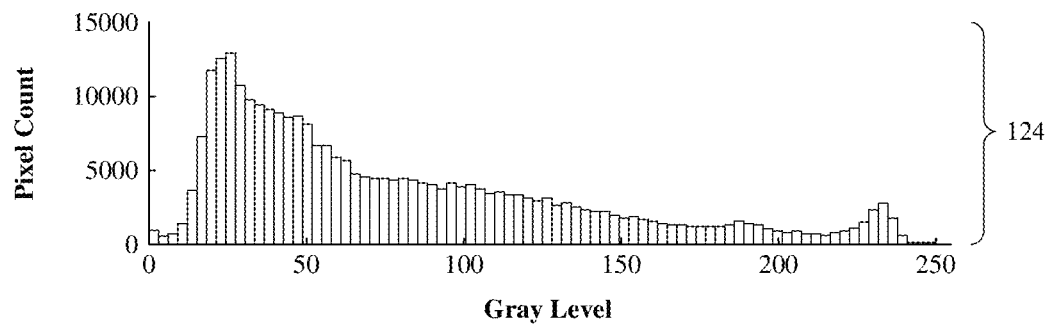

As illustrated by FIG. 6, a gray level distribution 124 is determined for pixels of the grayscale image 110 in the ROI 118 (e.g., ROI pixels). The ROI pixels correspond to pixels that remain in the grayscale image 110 after subtracting pixels of the non-ROI 116 (e.g., non-ROI pixels). The non-ROI pixels correspond to the black region that is in the mask image 120 of FIG. 5A and that is overlaid on the grayscale image 110 in FIG. 5B. The gray level distribution 124 includes a pixel count for each gray level or quantile of gray levels.

Figure 7:
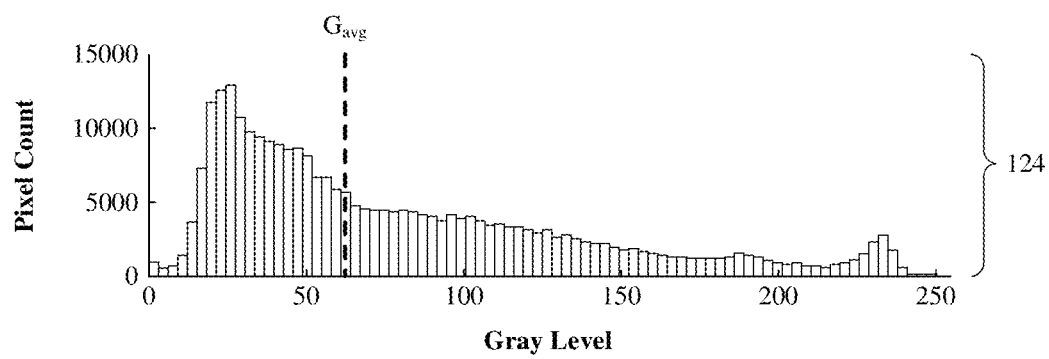

As illustrated by FIG. 7, an average gray level $G_{avg}$ is determined from the ROI pixels. As discussed in greater detail hereafter, the average gray level $G_{avg}$ is employed as a reference for normalization across multiple grayscale image.

Figure 8:
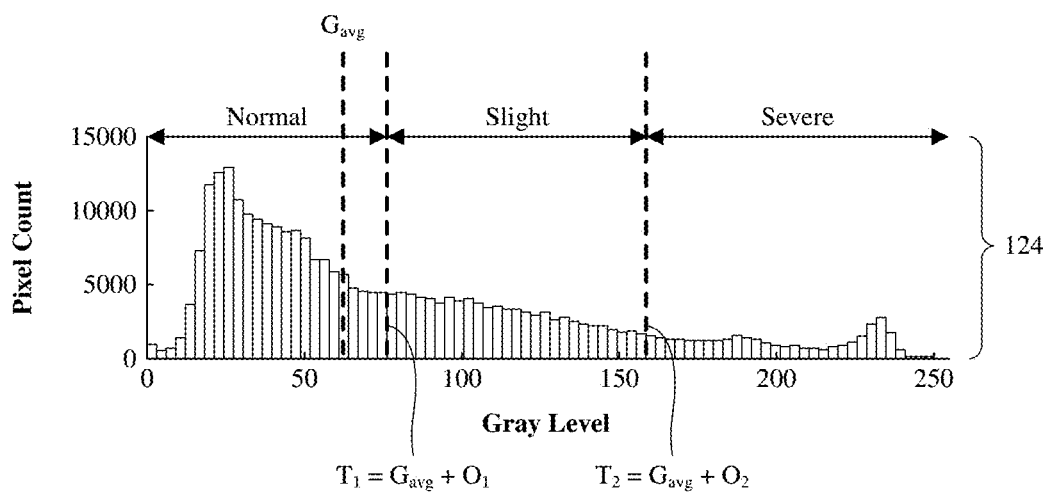

As illustrated by FIG. 8, the ROI pixels are categorized by gray level into a normal category, a severe category, and a slight category. In alternative embodiments, more or less categories are amenable. The normal category is defined by ROI pixels having a low likelihood of corresponding to etch redeposition. Such ROI pixels are identified as pixels with gray levels less than a first threshold $T_1$. The severe category is defined by ROI pixels having a high likelihood of corresponding to etch redeposition. Such ROI pixels are identified as ROI pixels having gray levels greater than a second threshold $T_2$. The slight category is defined by ROI pixels having a medium likelihood of corresponding to etch redeposition. Such ROI pixels are identified as ROI pixels having gray levels between the first and second thresholds $T_1$, $T_2$.

The first and second thresholds $T_1$, $T_2$ are functions of the average gray level $G_{avg}$ and corresponding offsets $O_1$, $O_2$ to allow for normalization. For example, the first threshold $T_1$ may be a summation of the average gray level $G_{avg}$ with a first offset $O_1$, and the second threshold $T_2$ may be a summation of the average gray level $G_{avg}$ with a second offset $O_2$ greater than the first offset $O_1$. Defining the first and second thresholds $T_1$, $T_2$ as above has the effect of using relative brightness differences of the ROI pixels for categorizing the ROI pixels without having to directly calculate the relative brightness differences for the ROI pixels.

Relative brightness difference for a given ROI pixel is a difference between the average gray level $G_{avg}$ and a gray level of the given ROI pixel. Because categorization is performed by mathematical comparisons of the gray levels of the ROI pixels to the first and second thresholds $T_1$, $T_2$, and because the first and second thresholds $T_1$, $T_2$ are summations of the average gray level $G_{avg}$ and the respective offsets $O_1$, $O_2$, the average gray level $G_{avg}$ may be subtracted from each side of the mathematical comparisons without changing the effect of the mathematical comparisons. Further, the mathematical comparisons may be rewritten as mathematical comparisons of the offsets $O_1$, $O_2$ to the relative brightness differences. Therefore, the offsets $O_1$, $O_2$ may be regarded as relative-brightness-difference thresholds for categorization of the ROI pixels, whereas the first and second thresholds $T_1$, $T_2$ may be regarded as gray-level thresholds for categorization of the ROI pixels.

Figure 9A:
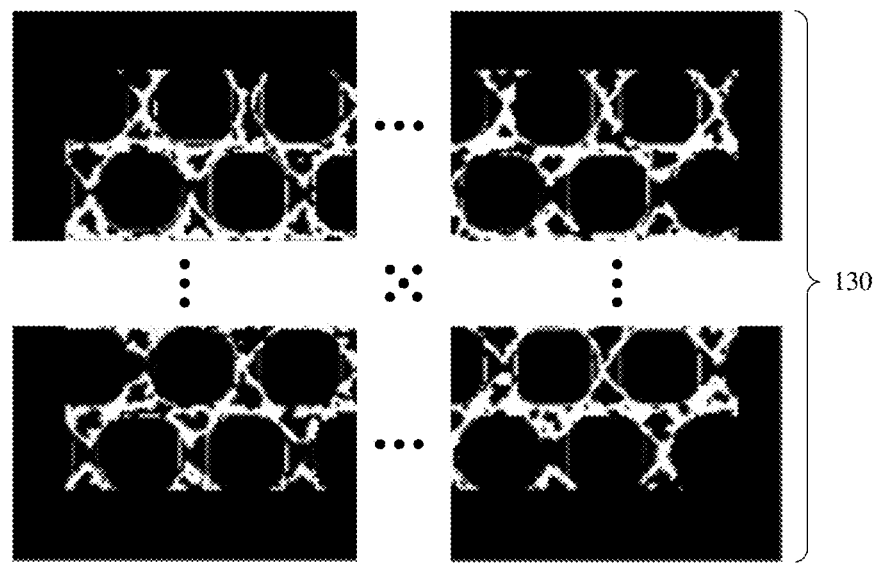
Figure 9B:
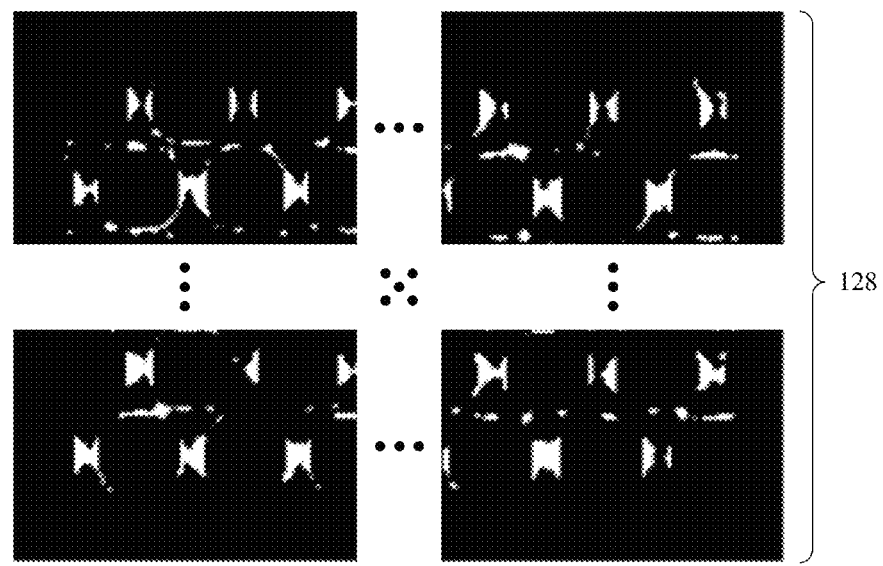
Figure 9C:
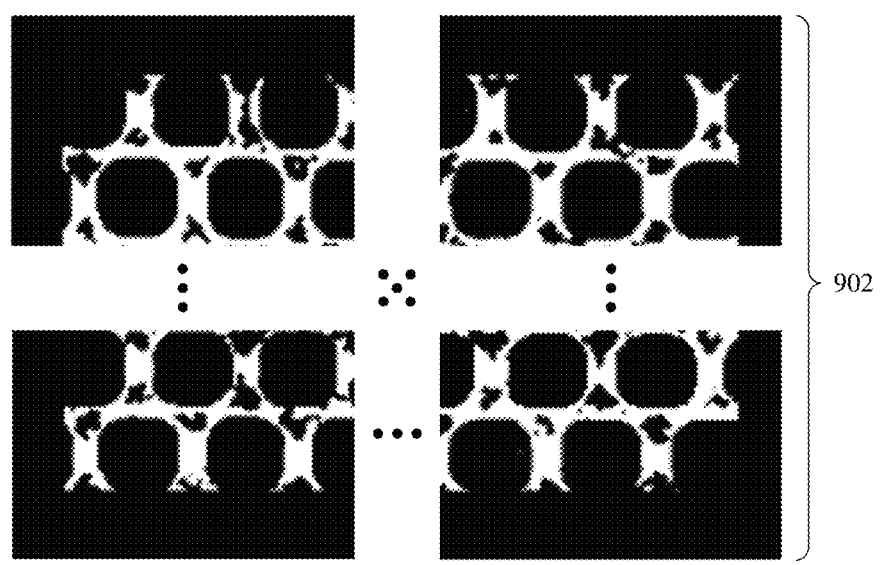

As illustrated by FIGS. 9A-9C, severe and slight ROI pixels are respectively illustrated in white. In FIG. 9A, a slight ROI image 130 illustrates ROI pixels categorized as slight in white while a remainder of pixels in the grayscale image 110 (see, e.g., FIG. 4) are black. In FIG. 9B, a severe ROI image 128 illustrates ROI pixels categorized as severe in white while a remainder of pixels in the grayscale image 110 are black. In FIG. 9C, a slight/severe ROI image 902 illustrates ROI pixels categorized as slight and severe in white while a remainder of pixels in the grayscale image 110 are black.

Figure 10:
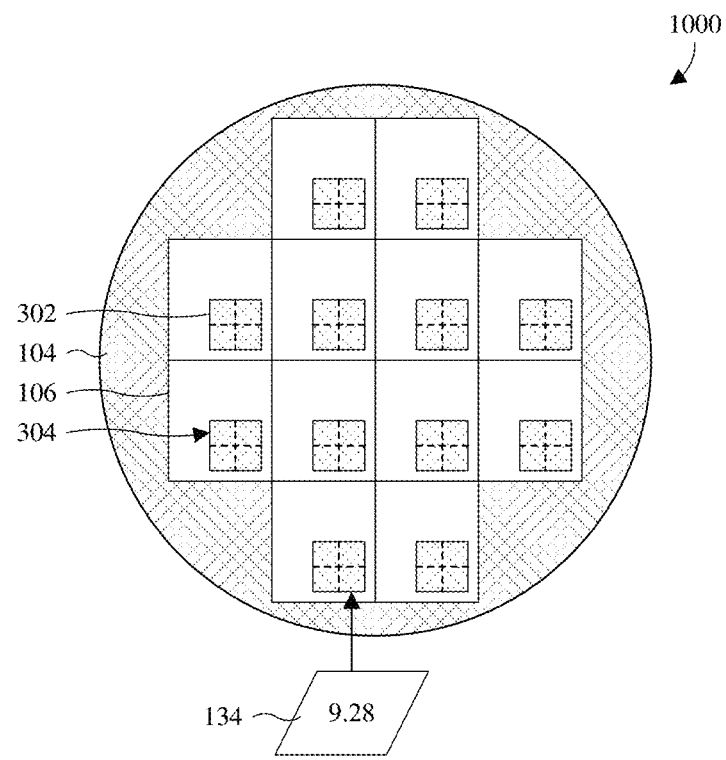

As illustrated by a diagram 1000 of FIG. 10, a score 134 is determined for the cell subregion 304 to which the grayscale image 110 (see, e.g., FIG. 4) corresponds. The score 134 is determined based on the numbers of ROI pixels in the different categories. The greater a ratio of the severe ROI pixels to a total number of ROI pixels, the higher the score. Further, in some embodiments, the greater a ratio of the slight ROI pixels to a total number of ROI pixels, the higher the score. In some embodiments, the score 134 is the percentage of ROI pixels that are severe (e.g., the number of severe ROI pixels divided by the total number of ROI pixels times 100). In other embodiments, the score 134 is the percentage of ROI pixels that are severe and slight. In some embodiments, the score 134 takes into account the number of severe and slight ROI pixels, but severe ROI pixels have a greater weight than slight ROI pixels. For example, severe ROI pixels may have 1.5-10 times the weight of slight ROI pixels in the score 134. In some of these embodiments, the score 134 may be equal to a ratio of the severe ROI pixels to a total number of ROI pixels times a weighting factor (e.g., 1.5-10) plus a ratio of the slight ROI pixels to a total number of ROI pixels plus.

Figure 11:
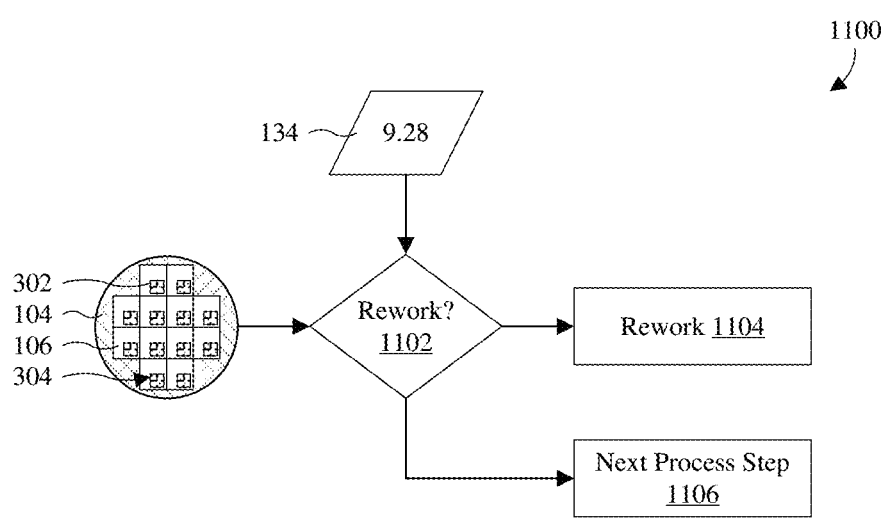

As illustrated by a diagram 1100 of FIG. 11, the wafer 104 undergoes processing based on the score 134. Particularly, a determination 1102 is made as to whether to rework the wafer 104 based on the score 134. The determination 1102 may also be based on other suitable parameters. In some embodiments, rework is deemed appropriate if the score 134 exceeds a threshold. To the extent that rework is deemed appropriate, the wafer 104 may undergo rework 1104. Otherwise, the wafer 104 may continue proceeding through a series of processing steps begun before the method to form the IC dies 106. In other words, a next process step 1106 in the series of processing steps may be performed.

While FIGS. 3, 4, 5A, 5B, 6-8, 9A-9C, 10, and 11 are described with reference to a method, it will be appreciated that the structures shown in FIGS. 3, 4, 5A, 5B, 6-8, 9A-9C, 10, and 11 are not limited to the method but rather may stand alone separate of the method. While FIGS. 3, 4, 5A, 5B, 6-8, 9A-9C, 10, and 11 are described as a series of acts, it will be appreciated that the order of the acts may be altered in other embodiments. While FIGS. 3, 4, 5A, 5B, 6-8, 9A-9C, 10, and 11 illustrate and describe as a specific set of acts, some acts that are illustrated and/or described may be omitted in other embodiments. Further, acts that are not illustrated and/or described may be included in other embodiments.

Additionally, it is to be appreciated that FIGS. 5A, 5B, 6-8, 9A-9C, and 10 may be automatically or semi automatically performed by an electronic processing device. As to semi-automatic embodiments, human input may be provided while carrying out the acts at FIGS. 5A, 5B, 6-8, 9A-9C, and 10. For example, human input may be provided to identify the cells 102 in the grayscale image 110, as described with regard to FIGS. 5A and 5B, whereas a remainder of the image processing described with regard to FIGS. 6-8, 9A-9C, and 10 may be fully automated. As to automatic embodiments, no human input may be provided while carrying out the acts at FIGS. 5A, 5B, 6-8, 9A-9C, and 10. This may, for example, allow for high throughput.

Figure 12:
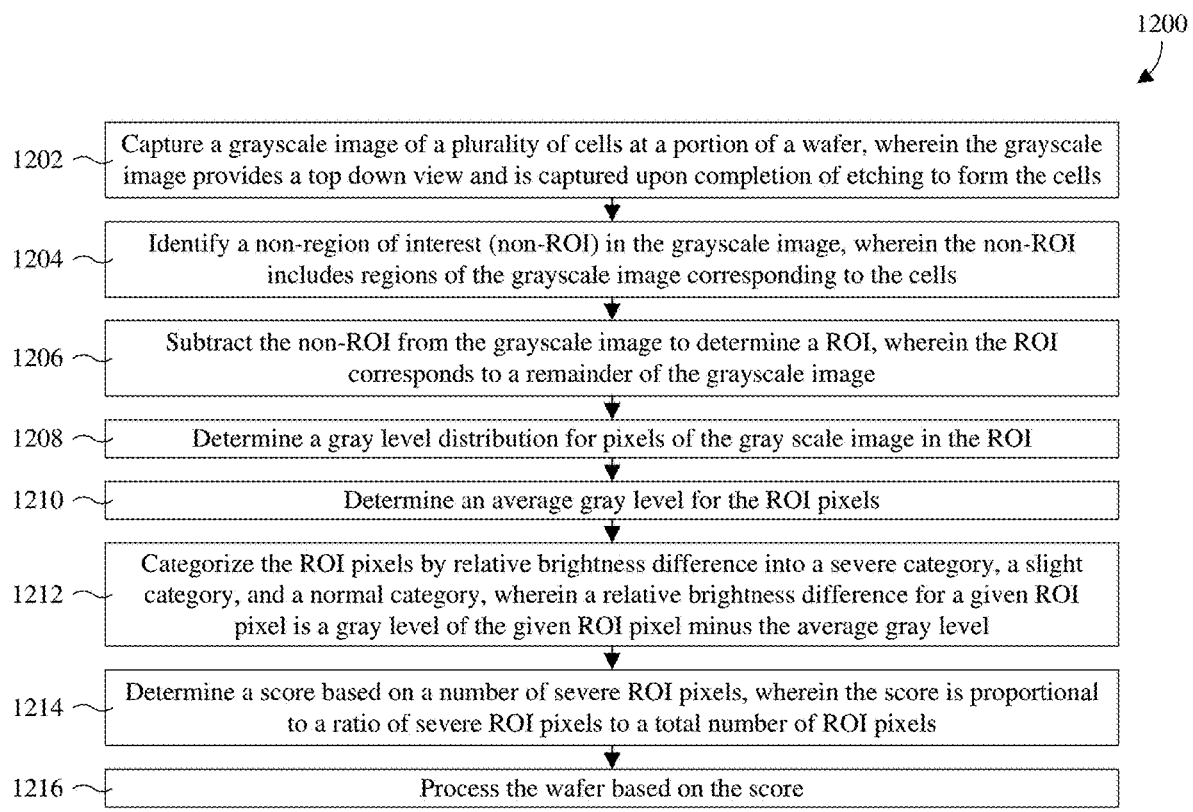
FIG. 12 illustrates a block diagram of some embodiments of the method of FIGS. 3, 4, 5A, 5B, 6-8, 9A-9C, 10, and 11.

With reference to FIG. 12, a block diagram 1200 of some embodiments of the method of FIGS. 3, 4, 5A, 5B, 6-8, 9A-9C, 10, and 11 is provided. In some embodiments, the method is performed using artificial intelligence (AI) for optimization and enhanced performance.

At 1202, a grayscale image of a plurality of cells at a portion of a wafer is captured, wherein the grayscale image provides a top down view and is captured upon completion of etching to form the cells. See, for example, FIGS. 3 and 4.

At 1204, a non-ROI is identified in the grayscale image, wherein the non-ROI includes regions of the grayscale image corresponding to the cells. See, for example, FIGS. 5A and 5B.

At 1206, the non-ROI is subtracted from the grayscale image to determine a ROI, wherein the ROI corresponds to a remainder of the grayscale image. See, for example, FIGS. 5A and 5B.

At 1208, a gray level distribution for pixels of the gray scale image in the ROI is determined. See, for example, FIG. 6.

At 1210, an average gray level is determined for the ROI pixels. See, for example, FIG. 7.

At 1212, the ROI pixels are categorized by relative brightness difference into a severe category, a slight category, and a normal category, wherein a relative brightness difference for a given ROI pixel is a gray level of the given ROI pixel minus the average gray level. See, for example, FIGS. 8 and 9A-9C.

At 1214, a score is determined based on a number of severe ROI pixels, wherein the score is proportional to a ratio of severe ROI pixels to a total number of ROI pixels. See, for example, FIG. 10.

At 1216, the wafer is processed based on the score. See, for example, FIG. 11.

While the block diagram 1200 of FIG. 12 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

Figure 13:
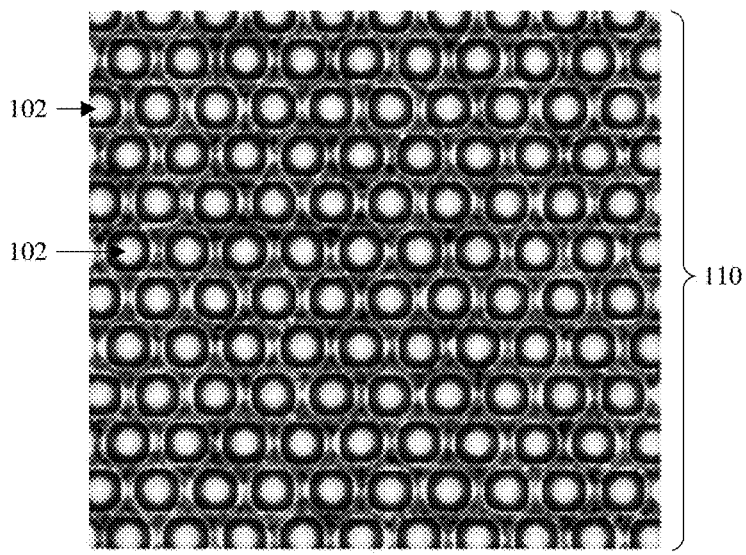
FIG. 13 illustrates some alternative embodiments of a grayscale image of FIG. 4.
Figure 14:
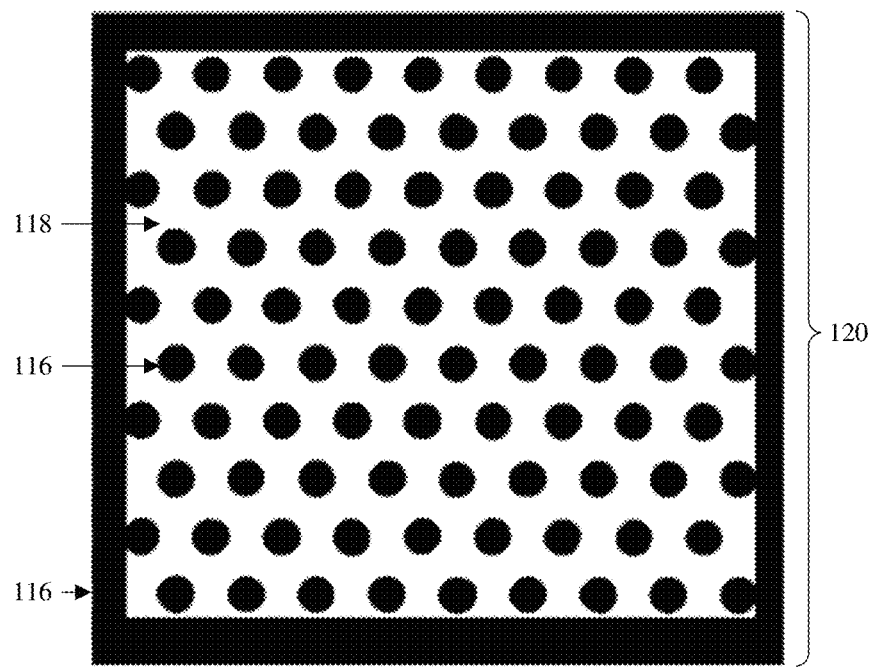
FIG. 14 illustrates some alternative embodiments of a mask image of FIG. 5A.
Figure 15A:
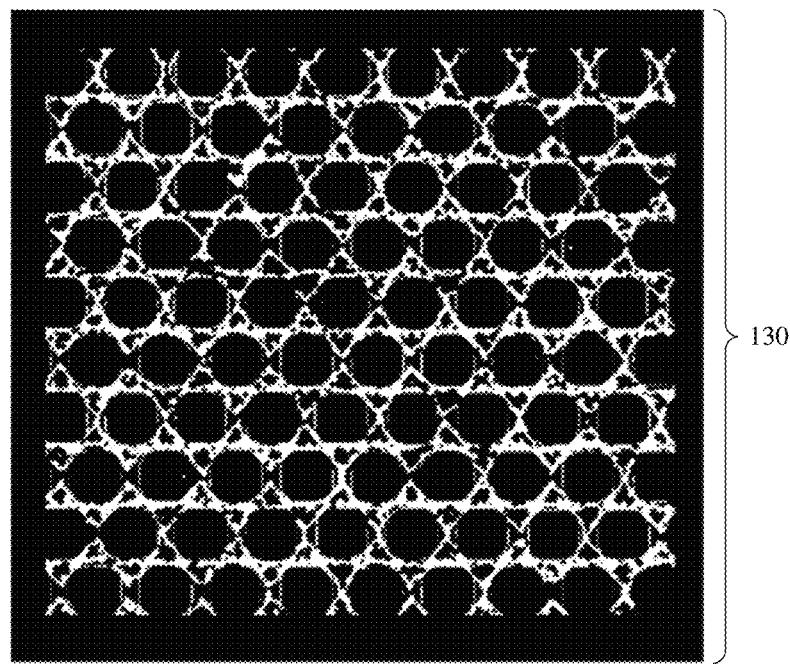
FIGS. 15A-15C illustrate some alternative embodiments respectively of a slight ROI image, a severe ROI image, and a slight/severe ROI image respectively of FIGS. 9A-9C.
Figure 15B:
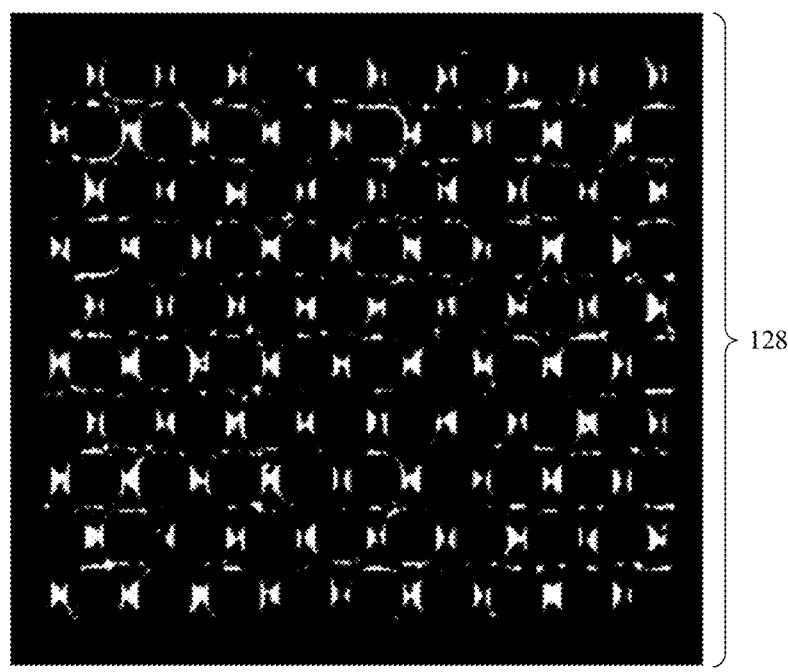
Figure 15C:
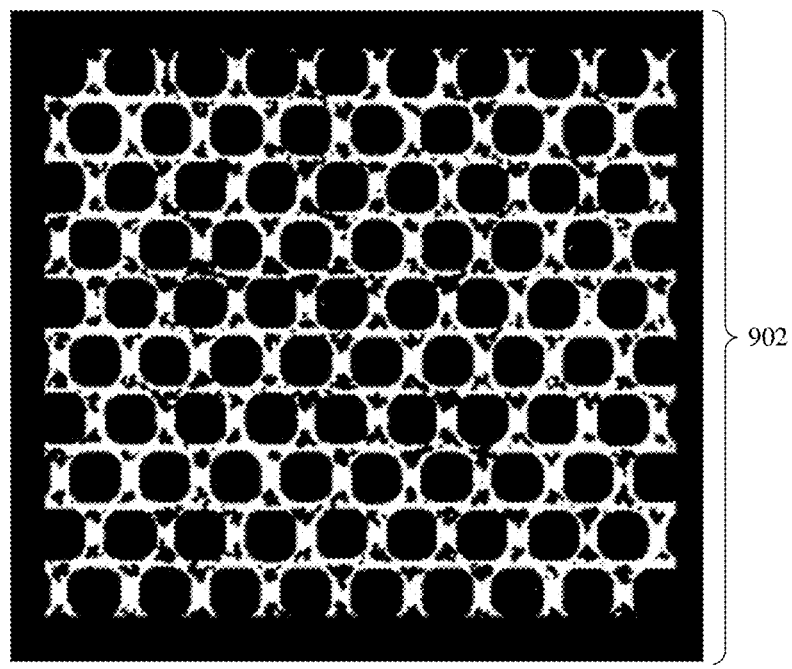

With reference to FIGS. 13, 14, and 15A-15C, some alternative embodiments of the images described above are provided. In FIG. 13, some alternative embodiments of the grayscale image 110 of FIG. 4 are provided in which the ellipses are removed and more detail is shown. In FIG. 14, some alternative embodiments of the mask image 120 of FIG. 5A are provided in which the ellipses are removed. In FIGS. 15A-15C, some alternative embodiments of the slight ROI image 130, the severe ROI image 128, and the slight/severe ROI image 902 respectively in FIGS. 9A-9C are provided in which the ellipses are removed.

With reference to diagram 1600 of FIG. 16, some alternative embodiments of the diagram 1000 of FIG. 10 are provided in which each of the cell subregions 304 has an individual score 134. Note that the individual scores 134 of the cell subregions 304 are only shown for one of the IC dies 106 due to space constraints. The scores 134 are individually determined for the cell subregions 304 by performing the acts described with regard to FIGS. 4, 5A, 5B, 6-8, 9A-9C, 10, and/or acts 1202-1214 in FIG. 12, for each of the cell subregions 304.

The scores 134 are combined by IC die 106 into die scores $134_{die}$. For example, the die score for a given IC die may be an average, a median, a minimum, a maximum, or a standard deviation of scores 134 of corresponding cell subregions 304. The die scores $134_{die}$ may then be employed to determine whether to rework the wafer 104. For example, if a threshold number of the die scores $134_{die}$ exceed a threshold, the wafer 104 may be wholly reworked. As another example, if any of the die scores $134_{die}$ exceed a threshold, only the corresponding IC dies may be reworked. If the foregoing rework criteria are unmet, the wafer 104 may proceed according to a series of processing steps to form an IC at each of the IC dies 106.

With reference to FIGS. 17A and 17B, 18, 19, 20A, 20B, and 21-28, some embodiments of a method for forming an IC with non-destructive inspection of cell etch redeposition is provided. The non-destructive inspection may, for example, be performed according to the method in any of FIGS. 1, 2A, 2B, and 12.

As illustrated by the diagrams 1700A, 1700B of FIGS. 17A and 17B, a plurality of IC dies 106 is partially formed on a wafer 104. FIG. 17A provides a top layout diagram 1700A, whereas FIG. 17B provides a cross-sectional diagram 1700B along a portion of line A in FIG. 17A. The IC dies 106 have individual cell regions 302. At the cell regions 302, a plurality of bottom electrode vias (BEVAs) 1702b overlie the wafer 104 at a top of an interconnect structure 1704. The BEVAs 1702b are conductive and include corresponding plugs 1706 and corresponding liners 1708 cupping undersides of the plugs 1706. The liners 1708 are configured to block outward diffusion of material from the plugs 1706.

The interconnect structure 1704 comprises a plurality of wires 1710 and a plurality vias 1702. The vias 1702 include the BEVAs 1702b and are alternatingly stacked with the wires 1710 to define conductive paths from the BEVAs 1702b to access transistors 1712 (only partially shown) underlying the interconnect structure 1704 on the wafer 104. The wires 1710 and the vias 1702 are in an interlayer dielectric (ILD) layer 1714, intermetal dielectric (IMD) layers 1716, and etch stop layers (ESLs) 1718 that are stacked over the wafer 104.

The access transistors 1712 are defined in part by the wafer 104 and comprise corresponding source/drain regions 1720 in the wafer 104. Further, although not visible, the access transistors 1712 comprise corresponding gate stacks bordering the source/drain regions 1720. The access transistors 1712 may, for example, be metal-oxide-semiconductor field-effect transistors (MOSFETs) or some other suitable type of transistor. The wafer 104 may, for example, be or comprise a bulk wafer of monocrystalline silicon, a silicon-on-insulator (SOI) wafer, or some other suitable type of semiconductor wafer.

In some embodiments, the access transistors 1712 are separated from each other by a trench isolation structure 1722. The trench isolation structure 1722 comprises a dielectric material and may, for example, be a shallow trench isolation (STI) structure, a deep trench isolation (DTI) structure, or some other suitable trench isolation structure.

Figure 18:
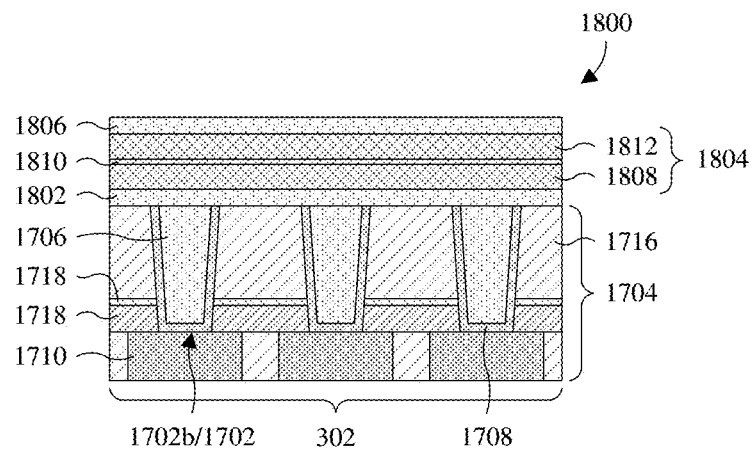

As illustrated by a cross-sectional diagram 1800 of FIG. 18, a bottom electrode layer 1802, an MTJ film 1804, and a top electrode layer 1806 are deposited stacked over the interconnect structure 1704. Note that only an upper portion of the interconnect structure 1704 is hereafter shown for drawing compactness. A remainder of the interconnect structure 1704 and other structure underlying the interconnect structure 1704 is as in FIG. 17B. The MTJ film 1804 comprises a fixed layer 1808, a barrier layer 1810 overlying the fixed layer 1808, and a free layer 1812 overlying the barrier layer 1810. The fixed layer 1808 and the free layer 1812 are ferromagnetic. Further, the fixed layer 1808 has a fixed magnetization, whereas the free layer 1812 has a magnetization that is free to change.

Figure 19:
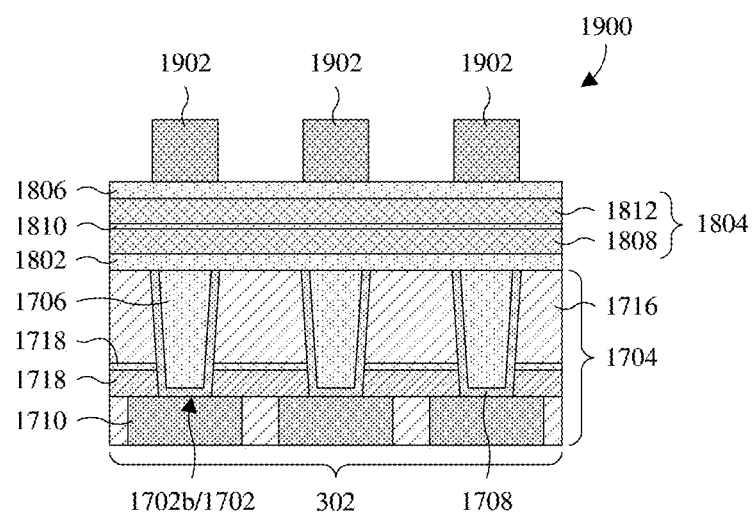

As illustrated by a cross-sectional diagram 1900 of FIG. 19, hard masks 1902 are formed over the top electrode layer 1806 respectively at locations to hereafter form MTJ cells. The hard masks 1902 may, for example, be or comprise silicon nitride and/or some other suitable dielectrics.

Figure 20A:
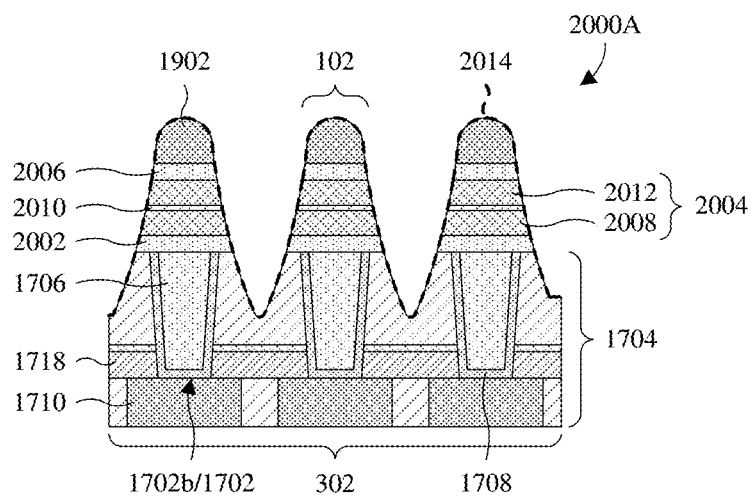
Figure 20B:
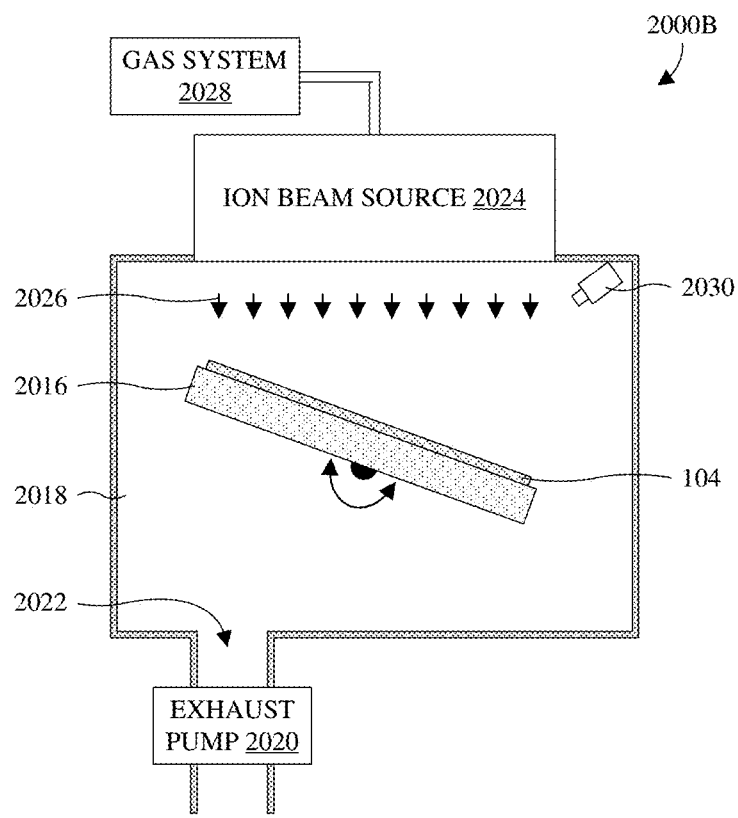

As illustrated by diagrams 2000A, 2000B of FIGS. 20A and 20B, an etch is performed into the bottom and top electrode layers 1802, 1806 (see, e.g., FIG. 19) and the MTJ film 1804 (see, e.g., FIG. 19) to form a plurality of cells 102 individual to and respectively on the BEVAs 1702b. FIG. 20A illustrates a cross-sectional diagram 2000A of the cells 102, and FIG. 20B illustrates a diagram 2000B of an etch process tool performing the etch.

Focusing on FIG. 20A, the cells 102 comprise individual bottom electrodes 2002, individual MTJs 2004 respectively overlying the bottom electrodes 2002, and individual top electrodes 2006 respectively overlying the MTJs 2004. The MTJs 2004 comprise individual fixed elements 2008, individual barrier elements 2010 respectively overlying the fixed elements 2008, and individual free elements 2012 respectively overlying the barrier elements 2010.

During operation of any one of the cells 102, a corresponding barrier element 2010 selectively allows quantum mechanical tunneling of electrons through the barrier element 2010. When the magnetizations of corresponding fixed and free elements 2008, 2012 are antiparallel, quantum mechanical tunneling may be blocked. As such, the cell may have a high resistance and may be in the first data state. When the magnetizations of the fixed and free elements 2008, 2012 are parallel, quantum mechanical tunneling may be allowed. As such, the cell may have a low resistance and may be in the second data state.

The etch is performed by ion beam etching (IBE). However, the etch may alternatively be performed by some other suitable type of dry etching using ion bombardment or some other suitable type of etching. IBE depends upon ion bombardment for etching. Particularly, kinetic energy is transferred from ions to the layer being etched to break off material of the layer. Because of the transfer of kinetic energy, etched material has a propensity to "fly" off and redeposit elsewhere in a somewhat uncontrollable manner. Depending upon the density of this etch redeposition 2014, the etch redeposition 2014 may increase leakage current and degrade yields. For example, when the etch redeposition 2014 is on sidewalls of the cells 102, the etch redeposition 2014 may create a conductive bridge that increases leakage current from the fixed elements 2008 to the free elements 2012. The etch redeposition may, for example, be or comprise tantalum, ruthenium, some other suitable conductive material(s), or any combination of the foregoing.

Focusing on FIG. 20B, a wafer table 2016 is in a process chamber 2018 and supports the wafer 104 (see, e.g., FIGS. 17A and 17B) and hence the structure of FIG. 19. Further, the wafer table 2016 is configured to rotate the wafer 104 about an axis extending into and out of the page. An exhaust pump 2020 is along a bottom of the process chamber 2018 at an exhaust port 2022 of the process chamber 2018. An ion beam source 2024 is along a top of the process chamber 2018 and generates an ion beam 2026 using process gases from a gas delivery system 2028. An imaging device 2030 is further in the process chamber 2018. The imaging device 2030 may, for example, be a SEM, a RSEM, or some other suitable type of imaging device. In alternative embodiments, the imaging device 2030 is external to the process chamber 2018.

Figure 21:
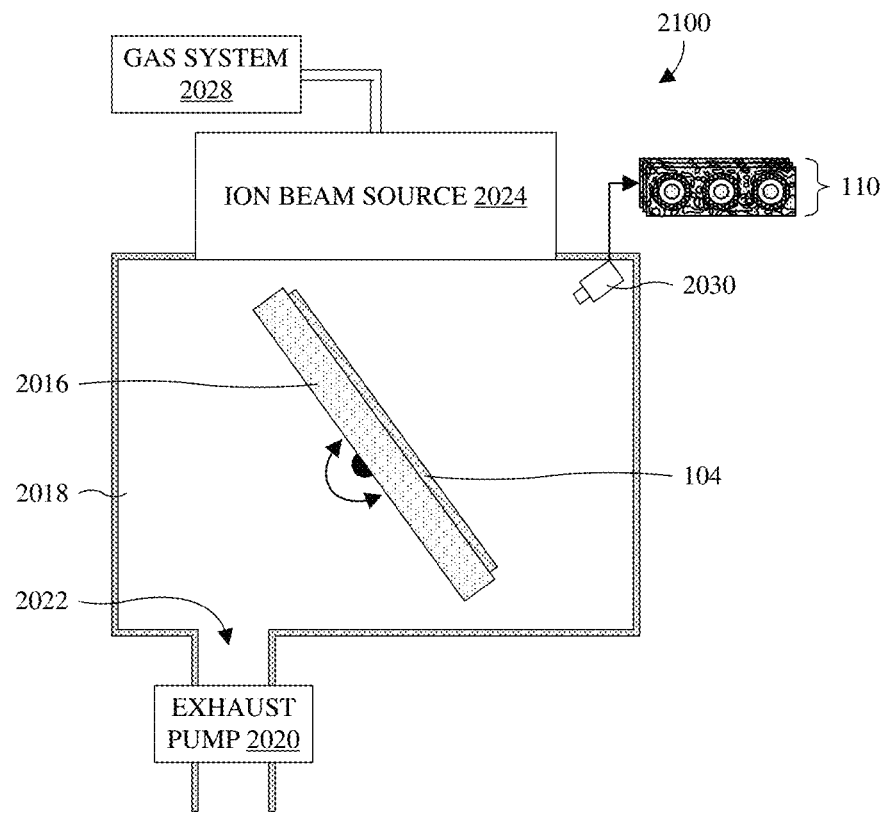

As illustrated by the diagram 2100 of FIG. 21, multiple grayscale images 110 of the cells 102 (see, e.g., FIG. 20A) are captured by the imaging device 2030. The capture is performed in situ within the process chamber 2018. By in situ, it is meant that the wafer 104 remains in the process chamber 2018 from a beginning of the etch described with regard to FIGS. 20A and 20B to an end of the image capture. In alternative embodiments, the capture is performed outside the process chamber 2018. The grayscale images 110 correspond to cells 102 at different portions of the wafer 104. For example, as described with regard to FIGS. 2B and 16, each IC die 106 may have a plurality of grayscale images and the grayscale images of each IC die 106 may correspond to different portions (e.g., cell regions and/or subregions) of the IC die. In some embodiments, a tilt of the wafer 104 is changed in advance of the capture to better focus the field of view of the imaging device 2030 on the cells 102.

Figure 22:
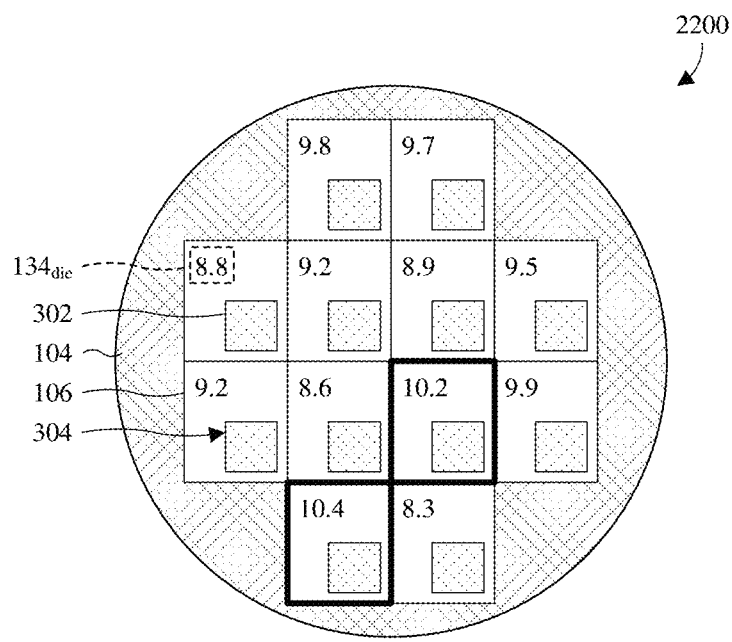

As illustrated by the diagram 2200 of FIG. 22, the grayscale images 110 undergo processing to determine individual die scores $134_{die}$ for the IC dies 106. The die scores $134_{die}$ are proportional to etch residue and, hence, higher scores lead to higher leakage current and lower yields. To determine the die scores $134_{die}$, the grayscale images 110 are individually processed according to the image processing at 112 of FIG. 1 and/or according to acts 1204-1214 of FIG. 12 to determine individual scores (e.g., 134 in FIG. 1). To the extent that an IC die is associated with a single grayscale image, the score of the single grayscale image is the die score of the IC die. To the extent that an IC die is associated with a plurality of grayscale images, the scores of the grayscale images are combined into the die score of the IC die. The scores may be combined by using an average function, a median function, a minimum function, a maximum function, a standard deviation function, or some other suitable function.

Also illustrated by the diagram 2200 of FIG. 22, the die scores $134_{die}$ of the IC dies 106 are assessed to determine which, if any, of the IC dies 106 to rework. Particularly, the die scores $134_{die}$ of the IC dies 106 are compared to a threshold and any IC dies with score in excess of the threshold are flagged for rework. For example, the threshold may be 10, such that two of the IC dies 106 are flagged for rework. Note that the flagged IC dies are highlighted by boxes having thick lines. In alternative embodiments, another suitable process is performed to flag which, if any, of the IC dies 106 to rework. To the extent that one or more IC dies 106 are flagged for rework, only the one or more IC dies 106 flagged for rework are reworked. In alternative embodiments, the wafer 104 may be wholly reworked.

Figure 23:
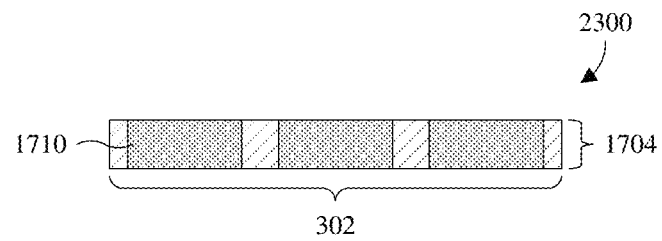
Figure 24:
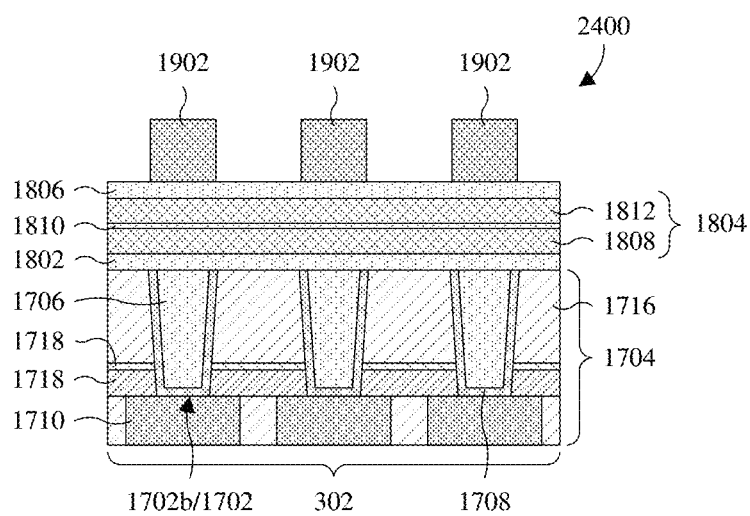
Figure 25:
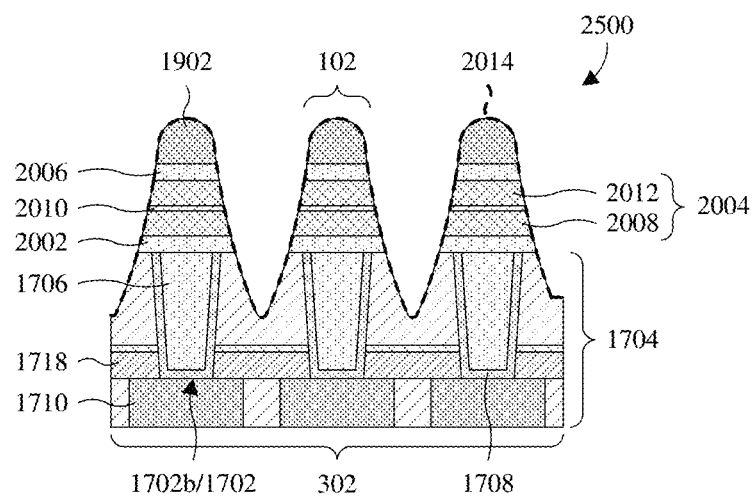

As illustrated by the cross-sectional diagrams 2300-2500 of FIGS. 23-25, the IC dies 106 flagged for rework at FIG. 22 undergo rework and, in some embodiments, the whole wafer 104 undergoes rework. In FIG. 23, the cells 102 and the BEVAs 1702*b* are removed. The removal may, for example, be performed by a chemical mechanical polish (CMP), etching, some other suitable removal process, or any combination of the foregoing. In FIG. 24, the BEVAs 1702*b* are reformed. Further, the bottom electrode layer 1802, the MTJ film 1804, the top electrode layer 1806, and the hard masks 1902 are reformed as described with regard to FIGS. 18 and 19. In FIG. 25, an etch is performed into the bottom and top electrode layers 1802, 1806 (see, e.g., FIG. 24) and the MTJ film 1804 (see, e.g., FIG. 24) to form the cells 102.

Figure 26:
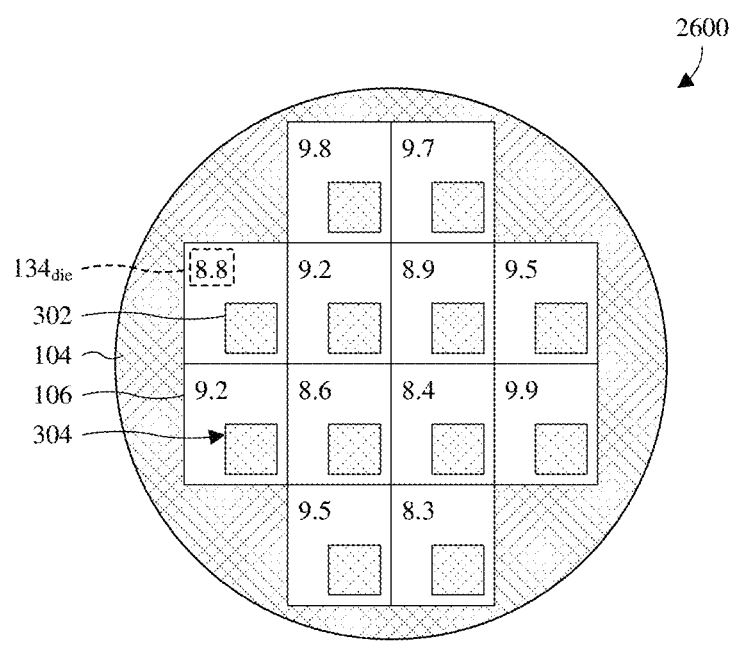

As illustrated by the diagram of FIG. 26, the acts described with regard to FIGS. 21 and 22 are repeated to determine which, if any, of the IC dies 106 to rework. Particularly, multiple grayscale images 110 of the cells 102 are captured by the imaging device 2030 as described with regard to FIG. 21. The grayscale images 110 then undergo processing to determine individual die scores $134_{die}$ for the IC dies 106 as described with regard to FIG. 22. Further, the die scores $134_{die}$ are assessed to determine which, if any, of the IC dies 106 to rework as described with regard to FIG. 22. To the extent that rework is appropriate, the acts described with regard to FIGS. 23-26 are repeated. To the extent that rework is inappropriate, the IC proceeds to completion. For example, the interconnect structure 1704 may be extended over the cells 102.

Figure 27:
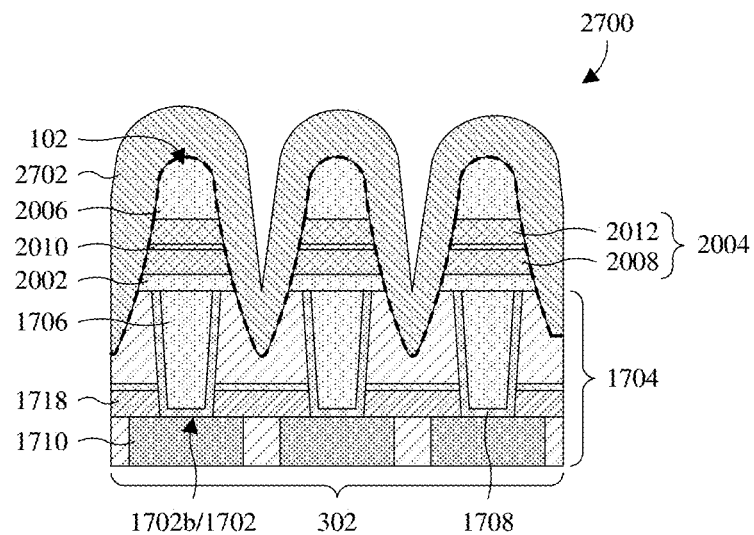

As illustrated by the cross-sectional diagram 2700 of FIG. 27, a cap layer 2702 is deposited over the cells 102. In some embodiments, the cap layer 2702 is deposited while the grayscale images 110 of FIG. 21 undergo processing at FIG. 22, such that the rework described with regard to FIGS. 23-25 includes removal of the cap layer 2702 and redeposition of the cap layer 2702. In alternative embodiments, the cap layer 2702 is deposited only after rework of the wafer 104 is completed. The cap layer 2702 may, for example, be or comprise silicon nitride and/or some other suitable dielectric(s).

Figure 28:
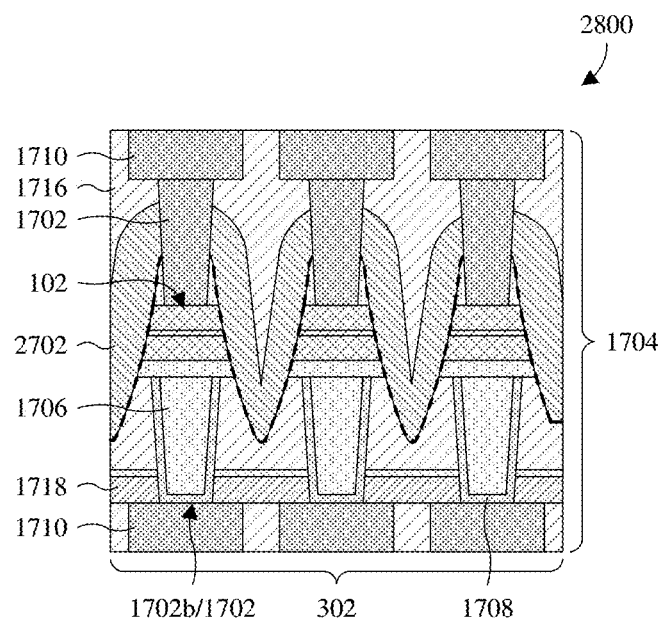

As illustrated by the cross-sectional diagram 2800 of FIG. 28, the interconnect structure 1704 is completed over the cells 102. This includes forming additional wires 1710 and additional vias 1702 stacked over and electrically coupled to the cells 102 in an additional IMD layer 1716.

While FIGS. 17A and 17B, 18, 19, 20A, 20B, and 21-28 are described with reference to a method, it will be appreciated that the structures shown in FIGS. 17A and 17B, 18, 19, 20A, 20B, and 21-28 are not limited to the method but rather may stand alone separate of the method. While FIGS. 17A and 17B, 18, 19, 20A, 20B, and 21-28 are described as a series of acts, it will be appreciated that the order of the acts may be altered in other embodiments. While FIGS. 17A and 17B, 18, 19, 20A, 20B, and 21-28 illustrate and describe as a specific set of acts, some acts that are illustrated and/or described may be omitted in other embodiments. Further, acts that are not illustrated and/or described may be included in other embodiments.

Figure 29:
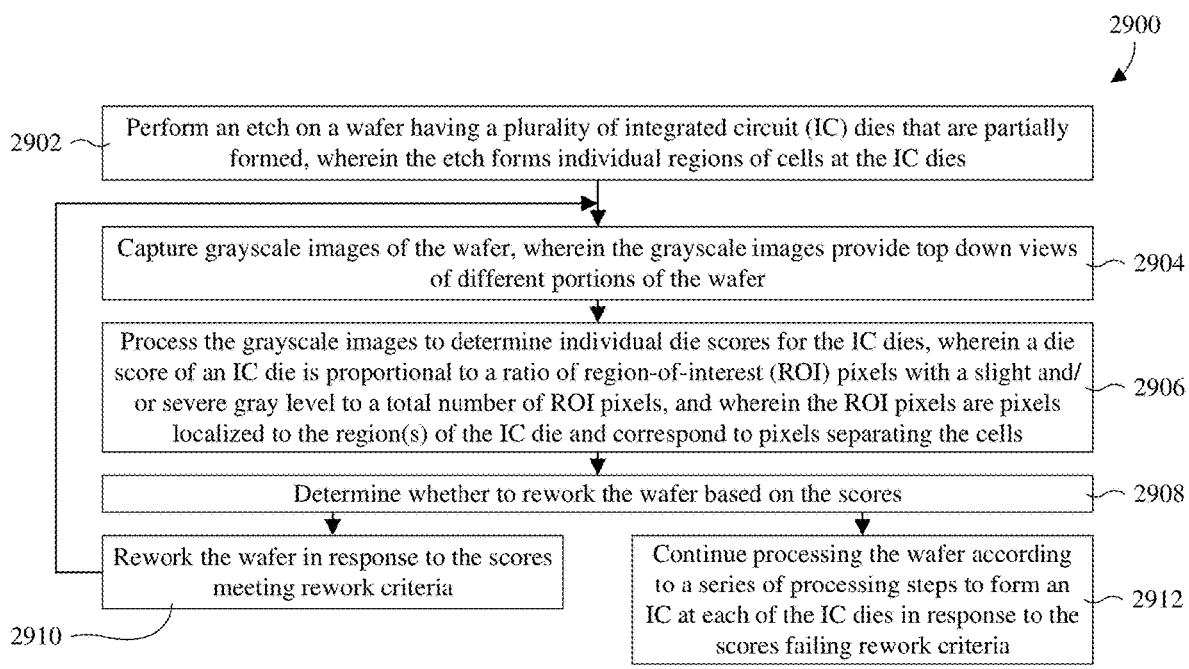
FIG. 29 illustrates a block diagram of some embodiments of the method of FIGS. 17A and 17B, 18, 19, 20A, 20B, and 21-28.

With reference to FIG. 29, a block diagram 2900 of some embodiments of the method of FIGS. 17A and 17B, 18, 19, 20A, 20B, and 21-28 is provided.

At 2902, an etch on a wafer having a plurality of integrated circuit (IC) dies that are partially formed, wherein the etch forms individual regions of cells at the IC dies. See, for example, FIGS. 17A, 17B, 18, 19, 20A, and 20B.

At 2904, grayscale images of the wafer are captured, wherein the grayscale images provide top down views of different portions of the wafer. See, for example, FIG. 21.

At 2906, the grayscale images are processed to determine individual die scores for the IC dies, wherein a die score of an IC die is proportional to a ratio of region-of-interest (ROI) pixels with a slight and/or severe gray level to a total number of ROI pixels, and wherein the ROI pixels are pixels localized to the region(s) of the IC die and correspond to pixels separating the cells. See, for example, FIGS. 22 and 26.

At 2908, a determination is made as to whether to rework the wafer based on the scores. See, for example, FIGS. 22 and 26.

At 2910, the wafer is reworked in response to the scores meeting rework criteria. See, for example, FIGS. 23-25.

At 2912, processing of the wafer continues according to a series of processing steps to form an IC at each of the IC dies in response to the scores failing rework criteria. For example, a next processing step in a series of processing steps to form an MRAM device on the wafer 104 may be performed. See, for example, FIGS. 27 and 28.

While the block diagram 2900 of FIG. 29 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

Figure 30:
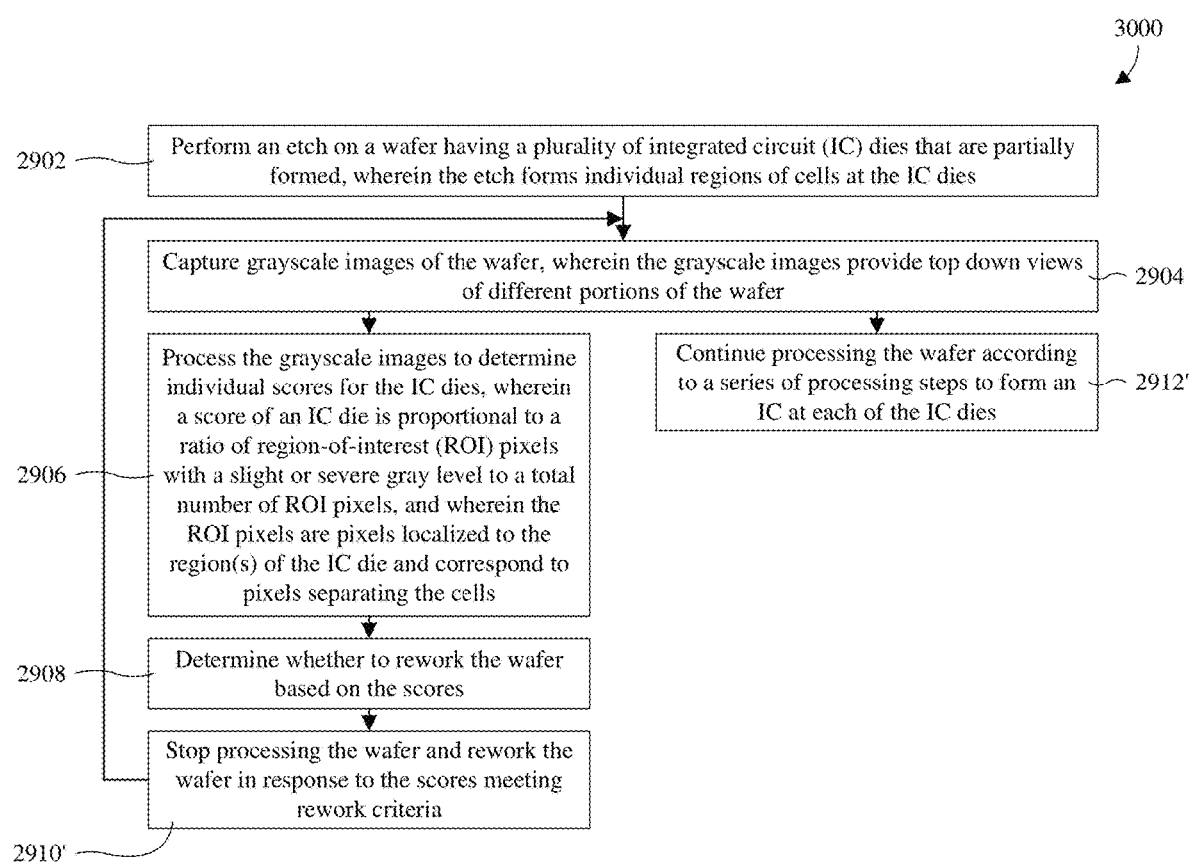
FIG. 30 illustrates a block diagram of some alternative embodiments of the method of FIG. 29 employing parallel processing of a wafer and grayscale images of the wafer.

With reference to FIG. 30, a block diagram 3000 of some alternative embodiments of the method of FIG. 29 is provided in which the method employs parallel processing of the wafer and the grayscale images. Particularly, processing of the wafer continues at 2912' while the grayscale images are processed at 2906. Further, the processing of the wafer continues according to a series of processing steps to form an IC at each of the IC dies. In response to rework criteria being met, the processing according to the series of processing steps is stopped and rework is performed at 2910'.

While the block diagram 3000 of FIG. 30 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

Figure 31:
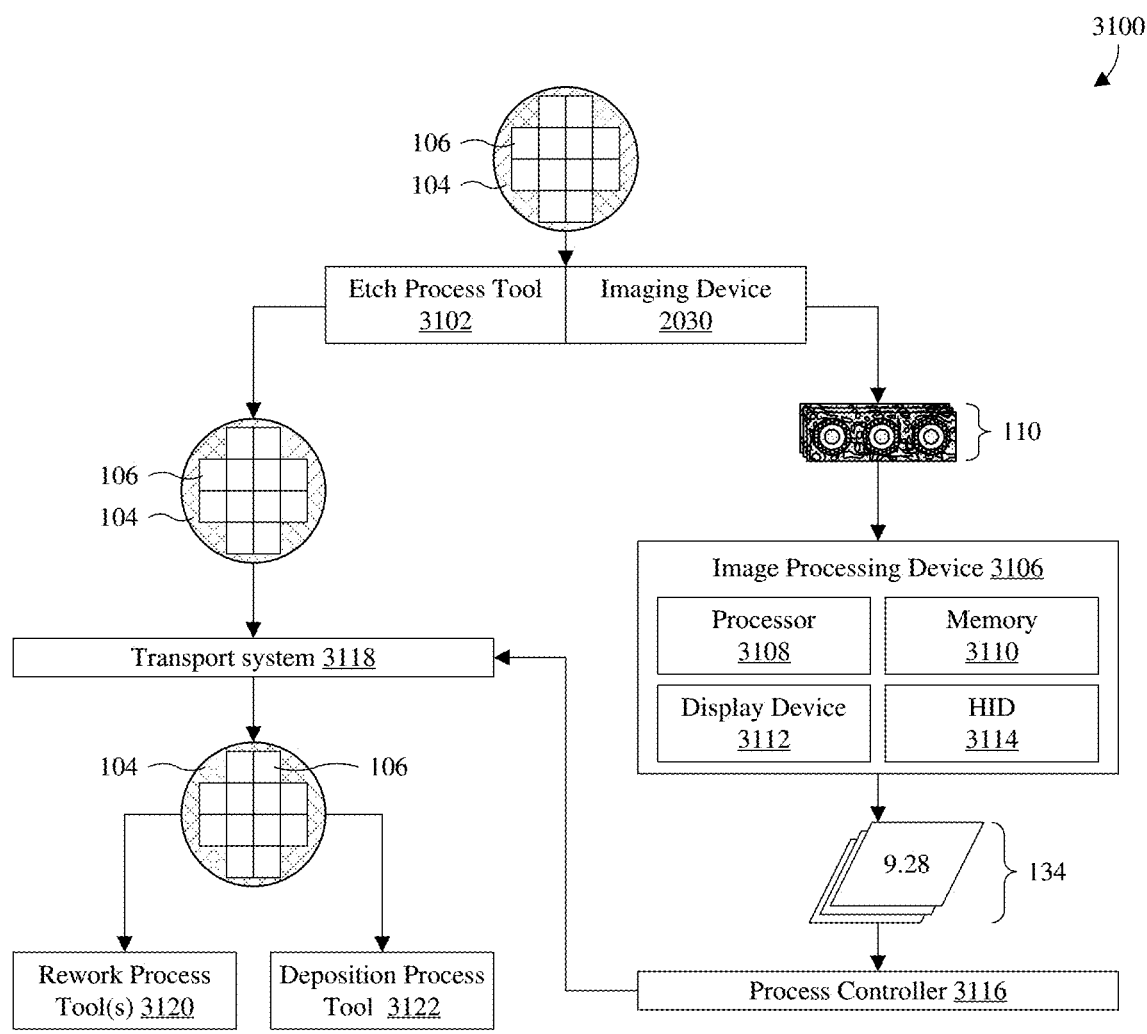
FIG. 31 illustrates a schematic diagram of some embodiments of a system for forming an IC with non-destructive inspection of cell etch redeposition.

With reference to FIG. 31, a schematic diagram 3100 of some embodiments of a system for forming an IC with non-destructive inspection of cell etch redeposition is provided. The system may, for example, be configured to perform any of the above described methods, including (but not limited) to the methods in FIGS. 1, 2A, 2B, 12, 29, and 30.

An etch process tool 3102 is configured to perform an etch on a wafer 104 to form a plurality of cells (not individually shown) spread across a plurality of IC dies 106 of the wafer 104. The cells may, for example, be MTJ cells, logic cells, or some other suitable type of cells. FIG. 20A provides a non-limiting example of the cells, and FIG. 20B provides a non-limiting example of the etch process tool 3102. Further, FIGS. 19, 20A, and 20B provide a non-limiting example of a process for performing the etch.

An imaging device 2030 is associated with the etch process tool 3102 and is configured to capture grayscale images 110 of the cells while the wafer 104 is still in a process chamber of the etch process tool 3102 upon completion of the etch. FIG. 21 provides non-limiting examples respectively of the imaging device 2030 and the etch process tool 3102 and further provides a non-limiting example of capture of the grayscale images 110. The grayscale images 110 provide top down views of the cells at different portions of the wafer. The imaging device 2030 may, for example, be a SEM or some other suitable imaging device.

An image processing device 3106 is configured to individually process the grayscale images 110 automatically or semi-automatically to determine scores 134 individually for the grayscale images 110. The processing may, for example, be performed as described with regard to any of FIGS. 1, 2A, 2B, and 12 and/or according to acts 1204-1214 of FIG. 12. In some embodiments, the processing for each of the grayscale images 110 is performed according to the imaging processing at 112 of FIG. 1. A non-limiting example of the processing for a single grayscale image is as illustrated and described with regard to FIGS. 3, 4, 5A, 5B, 6-8, 9A-9C, and 10. The image processing device 3106 is electronic and may, for example, be a computer, an application-specific integrated circuit (ASIC), a microcontroller, or some other suitable type of electronic device.

In some embodiments, the image processing device 3106 comprises an electronic processor 3108 and an electronic memory 3110. The electronic processor 3108 retrieves processor executable instructions for performing the processing of the grayscale images 110 from the electronic memory 3110. Further, the electronic processor 3108 executes the retrieved processor executable instructions to perform the processing of the grayscale images 110. In some embodiments, the image processing device 3106 further comprises or is associated with a display device 3112 and HID 3114. The display device 3112 may, for example, be configured to display the scores 134 and/or may, for example, be configured to display a GUI for interacting with the processing of the grayscale images 110. The HID 3114 may, for example, be configured to allow an individual to interact with the processing of the grayscale images 110 via the GUI. For example, the HID 3114 may be employed by an individual to identify cells within a grayscale image while performing the acts at 114 of FIG. 1.

A process controller 3116 is configured to assess the scores 134 to determine how to process the wafer 104. Particularly, the process controller 3116 is configured to determine whether to rework the wafer 104 or whether the wafer 104 should continue processing according to a series of processing steps to form an IC at each of the IC dies 106. The determination may, for example, be made by grouping and/or comparing the scores 134 to one or more thresholds. In some embodiments, if a threshold number of the scores 134 exceeds a threshold, rework may be in order. Otherwise, the wafer 104 may proceed without rework. The assessing may, for example, be performed as described with regard to act 136 at any of FIGS. 1, 2A, and 2B, as described with regard to any of FIGS. 11, 17, 22, and 26, as described with regard to act 1216 of FIG. 12, or according to any other suitable process. To the extent that the rework is in order, the process controller 3116 is configured to control a transport system 3118 to transport the wafer 104 to one or more rework process tool(s) 3120 for rework. Otherwise, the process controller 3116 is configured to control the transport system 3118 to transport the wafer 104 to a deposition process tool 3122 or some other suitable process tool for continuing processing of the wafer according to a series of processing steps to form an IC at each of the IC dies 106.

In view of the foregoing, some embodiments of the present disclosure provide a method including: capturing a grayscale image of a plurality of cells on a wafer, wherein the grayscale image provides a top down view and is captured upon completion of etching to form the cells; identifying the cells in the grayscale image; subtracting a region of the grayscale image corresponding to the identified cells from the grayscale image; scoring an amount of etch residue on sidewalls of, and in recesses between, the cells based on gray levels of remaining pixels at a remainder of the grayscale image; and processing the wafer based on a score from the scoring. In some embodiments, the cells are MTJs. In some embodiments, the cells are gate stacks of logic devices. In some embodiments, the method further includes, before the scoring, subtracting a peripheral region of the grayscale image that extends in a closed path along a periphery of the grayscale image. In some embodiments, the method further includes: determining an average gray level for the remaining pixels; and determining the score as a percentage of remaining pixels with a gray level exceeding a threshold, wherein the threshold is the average gray level plus a non-zero offset. In some embodiments, the method further includes performing the etching within a process chamber, wherein the capturing is performed within the process chamber, and wherein the wafer is within the process chamber continuously from a beginning of the etching to an end of the capturing. In some embodiments, the capturing is performed by a SEM. In some embodiments, the processing includes reforming the plurality of cells in response to the score exceeding a threshold. In some embodiments, the processing includes depositing a cap layer covering the cells in response a threshold exceeding the score.

In some embodiments, the present disclosure provides another method including: capturing a grayscale image of a plurality of cells on a wafer, wherein the grayscale image provides a top down view and is captured after etching to form the cells; performing image processing on the grayscale image, the image processing including: identifying the cells in the grayscale image; determining ROI pixels based on the identifying, wherein the ROI pixels includes pixels between the identified cells but not at the identified cells; determining an average gray level amongst the ROI pixels; determining a ratio of ROI pixels with gray levels exceeding a threshold to a total number of ROI pixels, wherein the threshold is greater than the average gray level; and processing the wafer based on the ratio. In some embodiments, the method further includes forming an IC on the wafer according to a series of processing steps, wherein the series includes the etching, and wherein a next processing step in the series is performed in parallel with the image processing. In some embodiments, the method further includes forming an IC on the wafer according to a series of processing steps, wherein the series includes the etching, and wherein a next processing step in the series is performed in series with the image processing. In some embodiments, the cells are arranged in an array including a plurality of rows and a plurality of columns. In some embodiments, the cells have a periodic pattern. In some embodiments, the method further includes: providing the wafer, wherein the wafer includes a plurality of IC dies blanketed by a multilayer stack; and performing the etching into the multilayer stack to form the plurality of cells, wherein the cells are at each of the IC dies. In some embodiments, the method further includes capturing a plurality of grayscale images corresponding to different subsets of the cells, wherein the plurality of grayscale images includes the grayscale image and is captured after the etching, and wherein the image processing is performed individually on each of the grayscale images.

In some embodiments, the present disclosure further provides a system including: an etch process tool configured to etch a multilayer film atop a wafer to form a plurality of cells from the multilayer film; an imaging device configured to capture a grayscale image of the cells, wherein the grayscale image provides a top down view of the cells; and an image processing device configured to: identify the cells in the grayscale image; subtract non-ROI pixels from the grayscale image, wherein the non-ROI pixels include pixels at the identified cells; and generate a score for an amount of etch residue on sidewalls of, and in recesses between, the cells based on gray levels of remaining pixels of the grayscale image; and a process controller configured to process the wafer based on the score. In some embodiments, the etch process tool includes a process chamber, wherein the imaging device is configured to capture the grayscale image while the wafer is in the process chamber. In some embodiments, the imaging device is a SEM. In some embodiments, the cells are MJTs.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    capturing a grayscale image of a plurality of cells on a wafer, wherein the grayscale image provides a top down view and is captured upon completion of etching to form the plurality of cells;
    identifying the plurality of cells in the grayscale image;
    subtracting a region of the grayscale image corresponding to the identified plurality of cells from the grayscale image;
    scoring an amount of etch residue on sidewalls of the plurality of cells and in recesses between the plurality of cells based on gray levels of remaining pixels at a remainder of the grayscale image; and
    processing the wafer differently depending on whether a score from the scoring exceeds a first threshold;
    wherein the scoring comprises determining a percentage of the remaining pixels with a gray level between a second threshold and a maximum gray level, and further determining another percentage of the remaining pixels with a gray level between the second threshold and a third threshold less than the second threshold, wherein the score is based on and proportional to the percentage and is further based on and proportional to the other percentage, which has a different weighting factor in the score than the percentage.

2. The method according to claim 1, wherein the plurality of cells comprise magnetic tunnel junctions (MTJs).

3. The method according to claim 1, wherein the plurality of cells are gate stacks of logic devices.

4. The method according to claim 1, further comprising:
    before the scoring, subtracting a peripheral region of the grayscale image that extends in a closed path along a periphery of the grayscale image.

5. The method according to claim 1, further comprising:
    determining an average gray level for the remaining pixels, wherein the second threshold is the average gray level plus a non-zero offset.

6. The method according to claim 1, further comprising:
performing the etching within a process chamber, wherein the capturing is performed within the process chamber, and wherein the wafer is within the process chamber continuously from a beginning of the etching to an end of the capturing.

7. The method according to claim 1, wherein the capturing is performed by a scanning electron microscope (SEM).

8. The method according to claim 1, wherein the processing comprises reforming the plurality of cells in response to the score exceeding the first threshold.

9. A method comprising:
capturing a grayscale image of a plurality of cells on a wafer, wherein the grayscale image provides a top down view and is captured after etching to form the plurality of cells;
performing image processing on the grayscale image, the image processing comprising:
identifying the plurality of cells in the grayscale image;
determining region of interest (ROI) pixels based on the identifying, wherein the ROI pixels includes pixels between the identified plurality of cells but not at the identified plurality of cells;
determining an average gray level amongst the ROI pixels;
determining a first ratio of a first number of the ROI pixels to a total number of the ROI pixels, wherein the first number is a number of the ROI pixels with gray levels exceeding a first threshold, and wherein the first threshold is greater than the average gray level;
determining a second ratio of a second number of the ROI pixels to the total number of the ROI pixels, wherein the second number is a number of the ROI pixels with gray levels exceeding a second threshold and less than the first threshold; and
combining the first ratio and the second ratio into a score, which increases and decreases with the first ratio and with the second ratio; and
processing the wafer based on the score;
wherein the combining comprises determining the score as a weighted summation of the first ratio and the second ratio, and wherein the first ratio and the second ratio have different weighting factors in the weighted summation.

10. The method according to claim 9, further comprising:
forming an integrated circuit (IC) on the wafer according to a series of processing steps, wherein the series includes the etching, and wherein a next processing step in the series is performed in series with the image processing.

11. The method according to claim 9, wherein the plurality of cells are arranged in an array comprising a plurality of rows and a plurality of columns.

12. The method according to claim 9, further comprising:
capturing a plurality of grayscale images corresponding to different subsets of the plurality of cells, wherein the plurality of grayscale images includes the grayscale image and is captured after the etching, and wherein the image processing is performed individually on each of the grayscale images.

13. The method according to claim 9, further comprising:
providing the wafer, wherein the wafer comprises a first integrated circuit (IC) die, and wherein the first IC die comprises the plurality of cells at a first region of the IC die and further comprises a second plurality of cells at a second region of the first IC die;
capturing a second grayscale image of the second plurality of cells, wherein the second grayscale image provides a top down view and is captured after etching to form the second plurality of cells; and
performing the image processing on the second grayscale image to generate another score.

14. The method according to claim 13, wherein the wafer comprises a second IC die, and wherein the method further comprises:
generating a composite score for the first IC die based on the score and the other score; and
reworking the first IC die in response to the composite score being greater than a third threshold without reworking the second IC die.

15. A method comprising:
providing a wafer comprising a first IC die and a second IC die, which respectively comprise a first plurality of cells and a second plurality of cells;
capturing a first grayscale image and a second grayscale image respectively of the first plurality of cells and the second plurality of cells, wherein the first grayscale image and the second grayscale image provide top down views;
performing image processing on the first grayscale image and the second grayscale image to respectively determine a first score and a second score, wherein the image processing comprises:
identifying the first plurality of cells in the first grayscale image;
determining a first region of interest (ROI) in the first grayscale image that is between and on sidewalls of the identified first plurality of cells;
determining a first ratio of a first number of pixels at the first ROI to a first total number of pixels at the first ROI, wherein the first number of pixels is a number of pixels at the first ROI with gray values that exceed a first threshold;
determining a second ratio of a second number of pixels at the first ROI to the first total number of pixels, wherein the second number of pixels at the first ROI is a number of pixels at the first ROI with gray values that exceed a second threshold and that are less than the first threshold;
determining the first score based on the first ratio and the second ratio, wherein the first score is equal to the first ratio times a weighting factor plus the second ratio, and wherein the weighting factor is greater than 1; and
processing the first and second IC dies respectively based on the first score and the second score.

16. The method according to claim 15, wherein the first score and the second score are respectively less than and greater than a third threshold, and wherein the processing of the first and second IC dies comprises reworking the second IC die while the first IC die persists.

17. The method according to claim 15, wherein the first ROI is substantially nonoverlapping with the identified first plurality of cells.

18. The method according to claim 15, wherein the image processing further comprises:
identifying the second plurality of cells in the second grayscale image;
determining a second ROI in the second grayscale image that is between and on sidewalls of the identified second plurality of cells;
determining a third ratio of a third number of pixels at the second ROI to a second total number of pixels at the second ROI, wherein the third number of pixels is a number of pixels at the second ROI with gray values that exceed the first threshold; and determining the second score based on the third ratio, wherein the higher the third ratio the higher the second score.

19. The method according to claim 9, wherein the capturing is performed by a scanning electron microscope (SEM).

20. The method according to claim 15, wherein the capturing is performed by a scanning electron microscope (SEM).

\* \* \* \* \*